(12) United States Patent
Moon et al.

(10) Patent No.: US 11,626,438 B2
(45) Date of Patent: *Apr. 11, 2023

(54) IMAGE SENSORS

(71) Applicant: Samsung Electronics Co., Ltd., Suwon-si (KR)

(72) Inventors: Joo Sung Moon, Seoul (KR); In Gyu Baek, Seoul (KR); Seung Han Yoo, Seongnam-si (KR); Hae Min Lim, Seoul (KR); Min Jung Chung, Hwaseong-si (KR); Jin Yong Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/384,865

(22) Filed: Jul. 26, 2021

(65) Prior Publication Data

US 2021/0358986 A1 Nov. 18, 2021

Related U.S. Application Data

(63) Continuation of application No. 16/413,190, filed on May 15, 2019, now Pat. No. 11,107,850.

(30) Foreign Application Priority Data

Oct. 2, 2018 (KR) .......................... 10-2018-0117409

(51) Int. Cl.
| | | |
|---|---|---|
| H01L 27/146 | (2006.01) | |
| H01L 27/142 | (2014.01) | |
| H04N 5/341 | (2011.01) | |

(52) U.S. Cl.
CPC ...... *H01L 27/14625* (2013.01); *H01L 27/142* (2013.01); *H04N 5/341* (2013.01)

(58) Field of Classification Search
None
See application file for complete search history.

(56) References Cited

U.S. PATENT DOCUMENTS

| | | |
|---|---|---|
| 9,565,375 B1 | 2/2017 | Raynor et al. |
| 11,107,850 B2 * | 8/2021 | Moon ............... H01L 27/14609 |
| 2010/0213572 A1 | 8/2010 | Ching et al. |

(Continued)

*Primary Examiner* — Alexander G Ghyka
(74) *Attorney, Agent, or Firm* — Myers Bigel, P.A.

(57) ABSTRACT

Image sensors are provided. The image sensor may include a substrate including a first surface and a second surface opposite the first surface, a photoelectric conversion layer in the substrate, and a lower capacitor connection pattern on the first surface of the substrate. The second surface of the substrate may be configured to receive incident light. The lower capacitor connection pattern may include a capacitor region and a landing region protruding from the capacitor region. The image sensors may also include a capacitor structure including a first conductive pattern, a dielectric pattern, and a second conductive pattern sequentially stacked on the capacitor region, a first wire on the capacitor structure and connected to the second conductive pattern, and a second wire connected to the landing region. The first conductive pattern may be connected to the lower capacitor connection pattern. A surface of the first wire facing the substrate and a surface of the second wire facing the substrate may be coplanar.

20 Claims, 18 Drawing Sheets

(56) References Cited

U.S. PATENT DOCUMENTS

| | | |
|---|---|---|
| 2014/0030842 A1 | 1/2014 | Chuang et al. |
| 2014/0312392 A1 | 10/2014 | Hiroshi |
| 2015/0028452 A1 | 1/2015 | Zhu et al. |
| 2015/0349005 A1 | 12/2015 | Yamashita et al. |
| 2016/0260759 A1 | 9/2016 | Kazuyoshi |
| 2017/0154908 A1 | 6/2017 | Kazuaki |
| 2018/0103226 A1 | 4/2018 | Raynor |

\* cited by examiner

IMAGE SENSORS

CROSS REFERENCE TO RELATED APPLICATION

This application is a continuation of U.S. patent application Ser. No. 16/413,190, filed May 15, 2019, which claims priority under 35 U.S.C. § 119 to Korean Patent Application No. 10-2018-0117409, filed on Oct. 2, 2018, the entire contents of which are hereby incorporated by reference.

FIELD

The present disclosure relates to an image sensor. More specifically, the present disclosure relates to a backside illumination (BSI) image sensor.

BACKGROUND

The image sensor is one of semiconductor elements that convert optical information into electric signals. The image sensor may include a charge coupled device (CCD) image sensor, and/or a complementary metal-oxide semiconductor (CMOS) image sensor.

Recently, a backside illumination (BSI) image sensor has been researched in which light is incident on a backside of a semiconductor substrate and is photoelectrically converted so that pixels in the image sensor have improved light-receiving efficiency and sensitivity.

SUMMARY

Some embodiments of the present invention provide an image sensor including relatively simple electrical connection between wirings because of a capacitor connection pattern having a landing region in a single electrode.

Some embodiments of the present invention also provide an image sensor that can be formed by relatively simple processes by forming a landing region protruding from a part of a single electrode.

According to an embodiment of the present disclosure, image sensors may include a substrate including a first surface and a second surface opposite the first surface, a photoelectric conversion layer in the substrate, and a lower capacitor connection pattern on the first surface of the substrate. The second surface of the substrate may be configured to receive incident light. The lower capacitor connection pattern may include a capacitor region and a landing region protruding from the capacitor region. The image sensors may also include a capacitor structure including a first conductive pattern, a dielectric pattern, and a second conductive pattern sequentially stacked on the capacitor region, a first wire on the capacitor structure and connected to the second conductive pattern, and a second wire connected to the landing region. The first conductive pattern may be connected to the lower capacitor connection pattern. A surface of the first wire facing the substrate and a surface of the second wire facing the substrate may be coplanar.

According to the aforementioned and other embodiment of the present disclosure, image sensors may include a substrate including a first surface and a second surface that is opposite the first surface and a first structure which is on the first surface of the substrate and includes a first lower capacitor connection pattern and a first capacitor structure. The second surface of the substrate may be configured to receive incident light. The first lower capacitor connection pattern may include a capacitor region and a landing region protruding from the capacitor region. The image sensors may also include a second structure which is spaced apart from the first structure and includes a second lower capacitor connection pattern and a second capacitor structure, a first wire on the first structure and connected to the landing region, a second wire that is on the first structure and the second structure and is connected to the first capacitor structure and the second capacitor structure, and a lens on the second surface of the substrate. A surface of the second lower capacitor connection pattern facing the substrate and a surface of the first lower capacitor connection pattern facing the substrate may be coplanar, and a surface of the second capacitor structure facing the substrate and a surface of the first capacitor structure facing the substrate may be coplanar. The first capacitor structure may include a first conductive pattern, a dielectric pattern, and a second conductive pattern.

According to the aforementioned and other embodiment of the present disclosure, image sensors may include a substrate including a first surface and a second surface opposite the first surface and a first capacitor connection pattern on the first surface of the substrate. The first capacitor connection pattern may include a capacitor region and a landing region, and the landing region may protrude from a portion of one side wall of the capacitor region in a first direction in plan view. The image sensors may also include a first capacitor structure on the capacitor region, a first wire on the first capacitor structure and connected to the landing region, and a lens on the second surface of the substrate.

However, it will be understood that the present invention is not limited to the description provided above. The present invention will become more apparent to one of ordinary skill in the art to which the present invention pertains by referencing the detailed description given below.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION

Hereinafter, image sensors according to some embodiments of the present invention will be described with reference to FIGS. 1 to 22.

Figure 1:
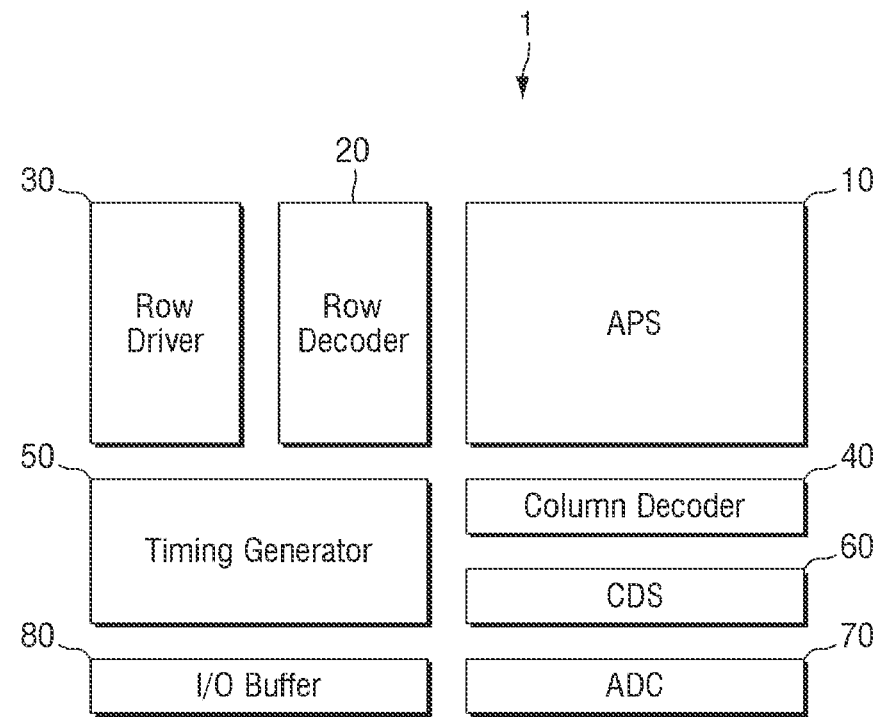
FIG. 1 is a block diagram of an image sensor according to some embodiments of the present invention.

FIG. 1 is a block diagram of an image sensor according to some embodiments of the present invention.

Referring to FIG. 1, an image sensor 1 according to some embodiments may include an active pixel sensor array (APS) 10, a row decoder 20, a row driver 30, a column decoder 40, a timing generator 50, a correlated double sampler (CDS) 60, an analog-to-digital converter (ADC) 70, and an I/O buffer 80.

The active pixel sensor array 10 may include a plurality of unit pixel regions two-dimensionally arranged, and may convert an optical signal into an electric signal. The active pixel sensor array 10 may be driven by a plurality of driving signals such as pixel select signals, reset signals, and electric charge transmission signals, from the row driver 30. Also, the electrical signal converted by the active pixel sensor array 10 may be provided to the correlated double sampler 60.

The row driver 30 may provide a large number of driving signals for driving the plurality of unit pixel regions of the active pixel sensor array 10, in accordance with the result decoded by the row decoder 20. When the unit pixel regions are arranged in a matrix form, the driving signal may be provided for each row.

The timing generator 50 may provide a timing signal and a control signal to the row decoder 20 and the column decoder 40.

The correlated double sampler (CDS) 60 may receive, hold, and sample the electrical signal generated by the active pixel sensor array 10. The correlated double sampler 60 may doubly sample a specific noise level and a signal level due to the electric signal to output a difference level corresponding to a difference between the noise level and the signal level.

The analog-to-digital converter (ADC) 70 may convert the analog signal corresponding to the difference level output from the correlated double sampler 60 into a digital signal and output the digital signal.

The I/O buffer 80 may latch the digital signal, and the latched signal may sequentially output the digital signal to a video signal processing unit (not illustrated) in accordance with the decoding result from the column decoder 40.

Figure 2:
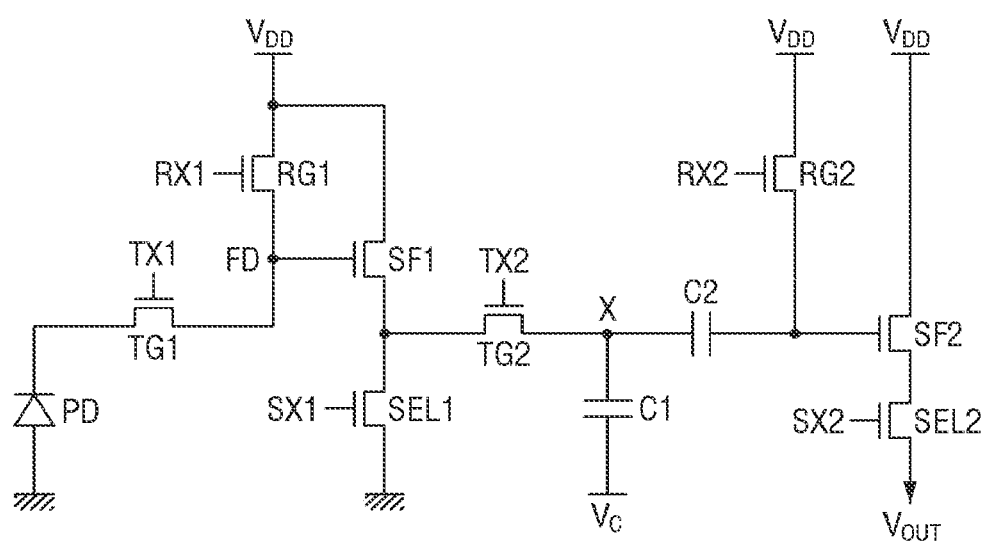
FIG. 2 is an exemplary circuit diagram of a pixel region of the image sensor according to some embodiments of the present invention.

FIG. 2 is a circuit diagram of a pixel region of the image sensor according to some embodiments of the present invention.

Referring to FIG. 2, the pixel region of the image sensor according to some embodiments may include a photoelectric conversion element PD, a first transmission transistor TG1, a floating diffusion region FD, a first reset transistor RG1, a first source follower transistor SF1, a first selection transistor SEL1, a second transmission transistor TG2, a first capacitor C1, a second capacitor C2, a second reset transistor RG2, a second source follower transistor SF2, and a second selection transistor SEL2.

The photoelectric conversion element PD may store light corresponding to an amount of light by absorbing light. The photoelectric conversion element PD may include, for example, a photo diode, a photo transistor, a photo gate, a pinned photo diode, an organic photo diode, a quantum dot, and combinations thereof.

The photoelectric conversion element PD may be coupled with the first transmission transistor TG1 that transmits the accumulated electric charge to the floating diffusion region FD. Since the floating diffusion region FD is a region in which the electric charge is converted into a voltage and the floating diffusion region FD has a parasitic capacitance, electric charges may be accumulatively stored.

One end of the first transmission transistor TG1 may be connected to the photoelectric conversion element PD, and the other end of the first transmission transistor TG1 may be connected to the floating diffusion region FD. The first transmission transistor TG1 may be made up of a MOS transistor driven by a predetermined bias (for example, the first transmission signal TX1). The first transmission transistor TG1 may transmit and/or may control transmitting the optical signal, which is an electric charge generated from the photoelectric conversion element PD, to the floating diffusion region FD in accordance with the first transmission signal TX1.

The first reset transistor RG1 may periodically reset the floating diffusion region FD. The first reset transistor RG1 may be made up of a MOS transistor which is driven by a reset line that applies a predetermined bias (e.g., a first reset signal RX1). When the first reset transistor RG1 is turned on by the first reset signal RX1, a predetermined electric potential provided to the drain of the first reset transistor RG1, for example, the power supply voltage VDD, may be transferred to the floating diffusion region FD.

The first source follower transistor SF1 may amplify a change in the electric potential of the floating diffusion region FD to which the electric charge accumulated in the photoelectric conversion element PD is transferred, and may supply the amplified electric potential to the second transmission transistor TG2. When the first source follower transistor SF1 is turned on, a predetermined electric potential provided to the drain of the first source follower transistor SF1, for example, the power supply voltage VDD, may be transferred to one end of the second transmission transistor TG2.

The first selection transistor SEL1 may turn on or turn off the first source follower transistor SF1. The first selection transistor SEL1 may be made up of a MOS transistor driven by a selection line that applies a predetermined bias (e.g., a first selection signal SX1).

One end of the second transmission transistor TG2 may be connected to one end of the first source follower transistor SF1, and the other end thereof may be connected to an X node. The second transmission transistor TG2 may be made up of a MOS transistor driven by a predetermined bias (e.g., the second transmission signal TX2). The second transmission transistor TG2 may transmit and/or may control transmitting the signal amplified by the first source follower transistor SF1 to the X node in accordance with the second transmission signal TX2.

One end of the first capacitor C1 and one end of the second capacitor C2 may be connected at the X node. The first capacitor C1 and the second capacitor C2 may store the electric charges received from the second transmission transistor TG2. The other end of the first capacitor C1 may be connected to an external voltage Vc.

An electric shutter type includes a rolling shutter type and a global shutter type. The rolling shutter type is a type of differently controlling the accumulation time for each row of the pixel array, and the global shutter type is a type of equally controlling the accumulation time for all the rows of the pixel array.

Since the sections of the global shutter in which all the unit pixels included in the active pixel sensor array (10 of FIG. 1) are exposed to light coincide with each other, unlike the rolling shutter, the global shutter may remove distortion of the image even for the moving image. Therefore, after the sections of each unit pixel exposed to light are terminated, until the output voltage VOUT that is output by itself is measured, each unit pixel may store the electric charges accumulated in the photodetecting element included in the unit pixel. According to some embodiments, in order to support the global shutter, the unit pixel includes a first capacitor C1 and a second capacitor C2 for temporarily storing the electric charge accumulated in the photoelectric conversion element PD.

One end of the second reset transistor RG2 may be connected to the power supply voltage VDD, and the other end of the second reset transistor RG2 may be connected to one end of the second capacitor C2. The second reset transistor RG2 may be gated by a second reset signal RX2. The second reset transistor RG2 may reset the first capacitor C1 or the second capacitor C2 to the power supply voltage VDD.

One end of the second source follower transistor SF2 may be connected to the power supply voltage VDD, and the other end of the second source follower transistor SF2 may be connected to one end of the second selection transistor SEL2. The second source follower transistor SF2 may be a driving transistor capable of generating an output voltage VOUT on the basis of the electric charge stored in the first capacitor C1 or the second capacitor C2. The second source follower transistor SF2 functions as a source follower buffer amplifier in combination with a constant current source located outside the pixel, and may amplify the electric potential change in the first capacitor C1 or the second capacitor C2 to generate the output voltage VOUT. The output voltage VOUT may be output to the second selection transistor SEL2.

One end of the second selection transistor SEL2 may be connected to the other end of the second source follower transistor SF2, and the other end of the second selection transistor SEL2 may be connected to the column line. The second selection transistor SEL2 may be gated by the second selection signal SX2. The second selection transistor SEL2 may output the output voltage VOUT to the column line connected to the pixel region.

The first transmission signal TX1, the first selection signal SX1, the first reset signal RX1, the second transmission signal TX2, the second selection signal SX2 and the second reset signal RX2 may be output, for example, from the row driver 30 of FIG. 1.

Figure 3:
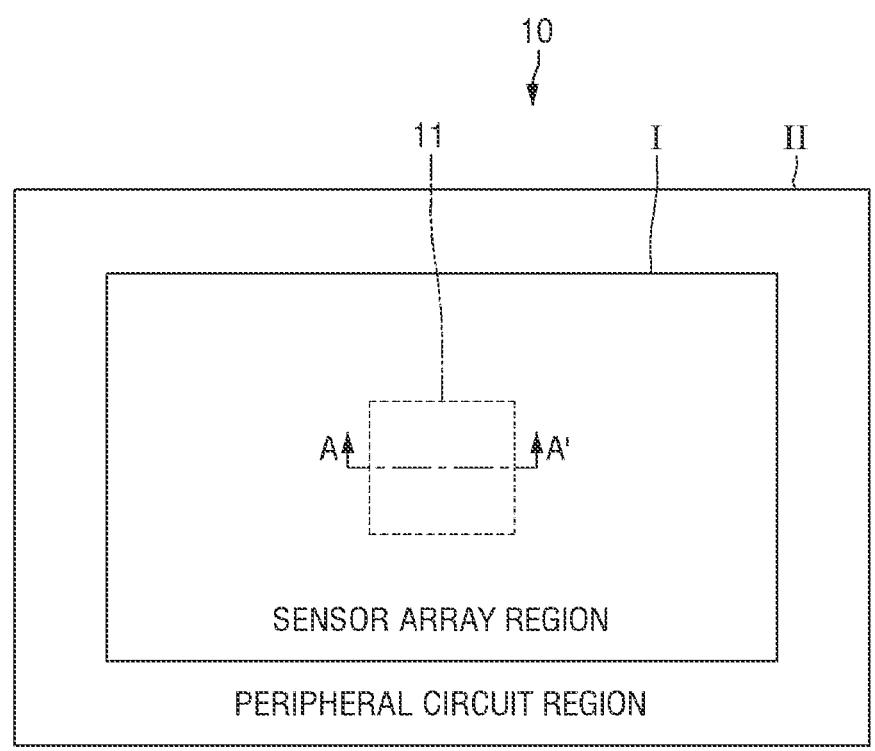
FIG. 3 is a schematic plan view of the image sensor according to some embodiments of the present invention.
Figure 4:
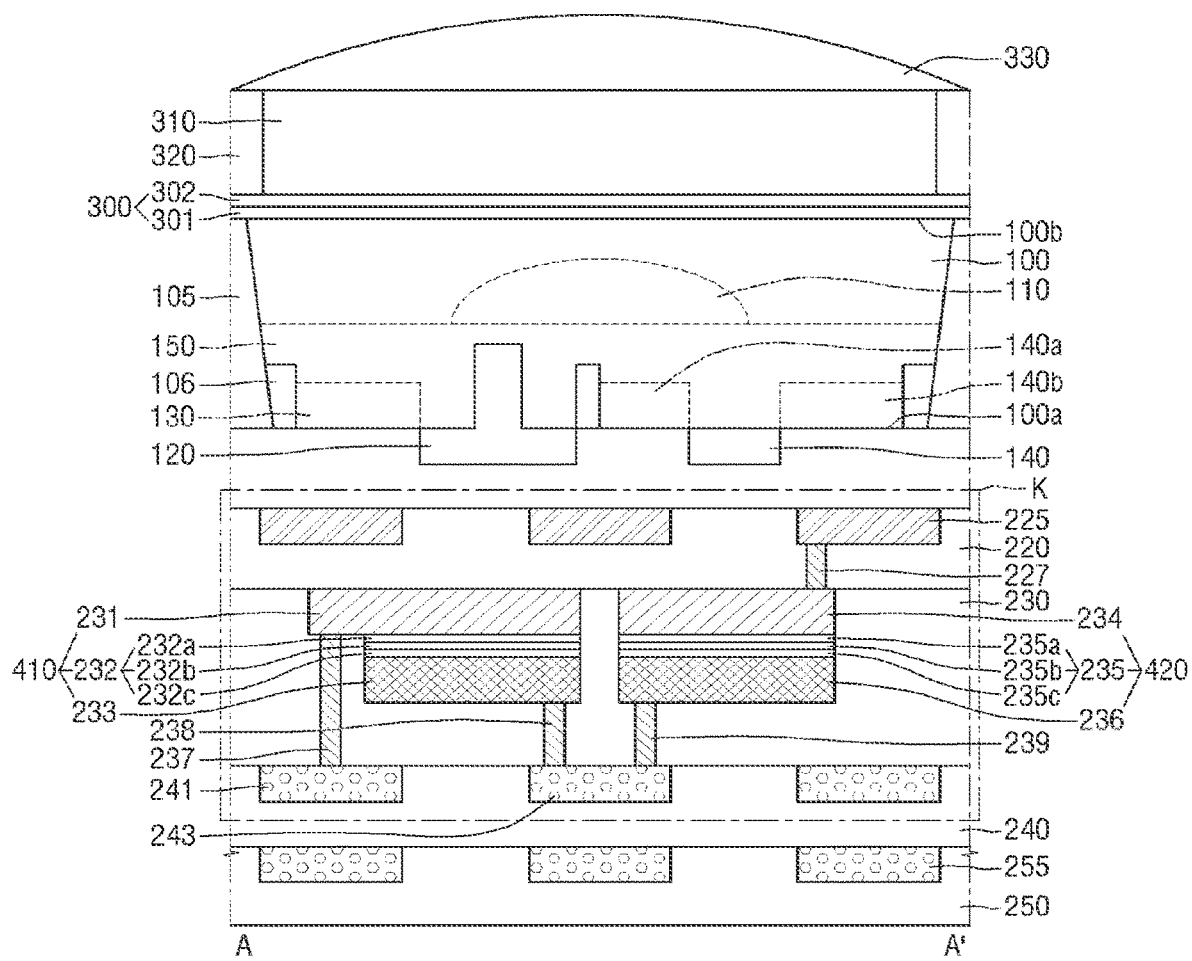
FIG. 4 is a cross-sectional view taken along the line A-A' of FIG. 3.

FIG. 3 is a schematic plan view of an image sensor according to some embodiments of the present invention. FIG. 4 is a cross-sectional view taken along the line A-A' of FIG. 3. For the sake of convenience of explanation, repeated parts of contents described with reference to FIGS. 1 and 2 will be briefly explained or omitted.

Referring to FIG. 3, the image sensor 1 according to some embodiments may include a sensor array region I and a peripheral circuit region II. For convenience of description, a photoelectric conversion element, a transistor, a contact and a wiring are not illustrated in FIG. 3. The term "wiring" may refer to "wire" herein.

The sensor array region I may be, for example, a region in which the active pixel sensor array 10 of FIG. 1 is formed.

The active pixel sensor array 10 of the sensor array region I may include a plurality of pixel regions. For example, the active pixel sensor array 10 of the sensor array region I may include unit pixels.

The peripheral circuit region II may be, for example, a region in which the correlated double sampler 60, the analog-to-digital converter 70 and the like of FIG. 1 are formed. In FIG. 3, the peripheral circuit region II was illustrated to surround the sensor array region I, but the present invention is not limited thereto.

Referring to FIGS. 3 and 4, the image sensor 1 according to some embodiments of the present invention may include a substrate 100 of the sensor array region I, a first element isolation film 105, a well impurity layer 150 in the substrate 100, a floating diffusion region 130, a source region 140a, a drain region 140b, a transmission gate 120, a logic gate 140, a first wiring layer 220, an interlayer insulating film 230, a second wiring layer 240, a third wiring layer 250, an antireflection film 300, a color filter layer 310, a grid pattern 320, and a microlens 330

The substrate 100 may include a first surface 100a and a second surface 100b that is opposite the first surface 100a. The second surface 100b of the substrate 100 may be a surface on which light is incident.

The substrate 100 may have a structure in which a base substrate and an epitaxial layer are stacked. The substrate 100 may be, for example, a silicon substrate, a gallium arsenide substrate, a silicon germanium substrate, a ceramic substrate, a quartz substrate, a display glass substrate, or the like, and may be an SOI (semiconductor on insulator) substrate. However, the present invention is not limited thereto.

The photoelectric conversion layer 110 may be disposed in the substrate 100. The photoelectric conversion layer 110 generates photoelectric charges in proportion to intensity of incident light. For example, the photoelectric conversion layer 110 may be a photodiode.

In some embodiments, the photoelectric conversion layer 110 may be formed by doping the interior of the substrate 100 with impurities (e.g., impurity atoms). For example, the photoelectric conversion layer 110 may be formed by ion-implantation of n-type impurities into the substrate 100. In some embodiments, the photoelectric conversion layer 110 may have a difference in impurity concentrations between an upper part and a lower part of the photoelectric conversion layer 110 to have a potential gradient. For example, the photoelectric conversion layer 110 may be formed in a form in which a plurality of impurity regions are stacked.

The well impurity layer 150 may be disposed on the photoelectric conversion layer 110. The well impurity layer 150 may be formed by doping the interior of the substrate 100 with impurities (e.g., impurity atoms) having a conductivity type opposite to that of the photoelectric conversion layer 110. For example, the well impurity layer 150 may be formed by ion-implantation of p-type impurities.

The first element isolation film 105 may be disposed on the active pixel sensor array to define active pixels or reference pixels. That is, the first element isolation film 105 may surround the active pixel or reference pixel, may extend from the lower surface to the upper surface of the substrate 100, and may separate the active or reference pixels.

In some embodiments, the first element isolation film 105 may be formed by patterning the substrate 100 to form a deep trench and then embedding (e.g., forming) an insulating material in the deep trench. Thus, the first element isolation film 105 may be formed to extend from the lower surface to the upper surface of the substrate 100. In accordance with a patterning process, the first element isolation film 105 may have a shape in which a width of the upper surface is wider than a width of the lower surface, as illustrated in FIG. 4.

The first element isolation film 105 may be formed of an insulating material having a refractive index lower than that of the substrate 100. For example, when the substrate 100 is formed of silicon, the first element isolation film 105 may be formed of a silicon oxide film, a silicon nitride film, an undoped polysilicon film, air or a combination thereof.

Thus, the first element isolation film 105 may refract incident light obliquely incident on the photoelectric conversion layer 110. Further, the first element isolation film 105 may reduce or prevent moving of photocharges generated in a specific active pixel region by incident light to adjacent pixel regions due to a random drift. That is, the first element isolation film 105 may improve the light-receiving rate of the photoelectric conversion layer 110 and may improve the quality of the image data.

The second element isolation film 106 may be disposed on the active pixel or the reference pixel to define an active region. That is, the second element isolation film 106 may be formed in the well impurity layer 150 to define the region of the well impurity layer 150, in which the second element isolation film 106 is not formed, as the active region.

In some embodiments, the second element isolation film 106 may be formed by patterning the substrate 100 to form a shallow trench and then embedding (e.g., forming) the insulating material into the shallow trench. In some embodiments, the second element isolation film 106 may be an impurity region having the same conductivity type as that of the well impurity layer 150. In this case, the impurity concentration in the second element isolation film 106 may be higher than the impurity concentration of the well impurity layer 150.

In some embodiments, the depth of the shallow trench in which the second isolation layer 106 is formed may be shallower than the depth of the deep trench in which the first element isolation film 105 is formed, as illustrated in FIG. 4. A lower surface of the second element isolation film 106 may be substantially coplanar with a lower surface of the first element isolation film 105, but an upper surface of the second element isolation film 106 may be lower than an upper surface of the first element isolation film 105, as illustrated in FIG. 4. In addition, the second element isolation film 106 may be formed to be separated from the photoelectric conversion layer 110.

For example, the second element isolation film 106 may define the floating diffusion region 130, the source region 140a, and the drain region 140b in the well impurity layer 150. In some embodiments, the floating diffusion region 130, the source region 140a, and the drain region 140b may be formed by being doped with impurities (e.g., impurity atoms) having a conductivity type opposite to that of the well impurity layer 150. For example, the floating diffusion region 130 may be formed by an ion-implantation of the n-type impurities.

The transmission gate 120 may be disposed adjacent to the photoelectric conversion layer 110 and the floating diffusion region 130. Accordingly, the transmission gate 120 may transmit and/or may control transmitting the electric charge generated in the photoelectric conversion layer 110 to the floating diffusion region 130.

In some embodiments, as illustrated in FIG. 4, the transmission gate 120 may include a portion that is inserted into the substrate 100. For example, the transmission gate 120 may be formed, by forming a trench in an active region formed in the well impurity layer 150, sequentially forming a gate insulating film and a gate conductive film in the trench, and forming a gate spacer that is formed on a side wall of the gate conductive film. As a result, a part of the transmission gate 120 may be embedded into the well impurity layer 150. Such a transmission gate 120 may reduce the region of active pixels or reference pixels to enable high integration of the image sensor 1.

In some embodiments, the transmission gate 120 may be the first transmission transistor TG1 or the second transmission transistor TG2 of FIG. 2.

The logic gate 140 may be disposed adjacent to the source region 140a and the drain region 140b. The logic gate 140 may correspond at least one of the gate of the first reset transistor RG1, the gate of the second reset transistor RG2, the gate of the first source follower transistor SF1, the gate of the second source follower transistor SF2, the gate of the first selection transistor SEL1, and the gate of the second selection transistor SEL2 of FIG. 2.

For example, when the logic gate 140 is the gate of the first reset transistor RG1, the source region 140a or the drain region 140b may be connected to the power supply voltage VDD and the floating diffusion region (e.g., FD in FIG. 2) 130, respectively, and the logic gate 140 may periodically reset the electric charges accumulated in the floating diffusion region 130.

For example, when the logic gate 140 is the gate of the first source follower transistor SF1, the logic gate 140 may be connected to the floating diffusion region 130, may amplify the electric potential change in the floating diffusion region 130, and may transmit and/or may control transmitting the amplified electric potential to one end of the second transmission transistor TG2.

For example, when the logic gate 140 is the gate of the first selection transistor SEL1, the source region 140a or the drain region 140b may be connected to the drain electrode of the first source follower transistor SF1 to turn on or turn off the first source follower transistor SF1.

For example, when the logic gate 140 is the gate of the second reset transistor RG2, each of the source region 140a or the drain region 140b may be connected to one end of the second capacitor C2, the gate of the second source follower transistor SF2 and the power supply voltage VDD, and the logic gate 140 may periodically reset the electric charges stored in the first capacitor C1 or the second capacitor C2.

For example, when the logic gate 140 is the gate of the second source follower transistor SF2, the logic gate 140 may be connected to one end of the second capacitor C2 to amplify the electric potential change of the first capacitor C1 or the second capacitor C2 and may output the amplified electric potential to the output voltage VOUT.

For example, when the logic gate 140 is the gate of the second selection transistor SEL2, the source region 140a or the drain region 140b may be connected to the drain electrode of the second source follower transistor SF2 to output the output voltage VOUT to the column line connected to the pixel region.

The first wiring layer 220 may be disposed on the first surface 100a of the substrate 100. The first wiring layer 220 may include a plurality of first wirings 225. The first wiring layer 220 may transmit a plurality of driving signals such as a selection signal, a reset signal, and a transmission signal for operation of the image sensor 1 of FIG. 3. In addition, the first wiring layer 220 may connect the transmission gate 120 and the logic gate 140 which may be arranged in various forms.

The plurality of first wirings 225 may include, for example, metals such as tungsten (W), copper (Cu) and aluminum (Al), but the present invention is not limited thereto.

The interlayer insulating film 230 may be formed of an insulating material. For example, the interlayer insulating film 230 may be formed of a HDP (High Density Plasma) layer, TOSZ (Tonen SilaZene), SOG (Spin On Glass), USG (Undoped Silca Glass) and the like, but the present invention is not limited thereto.

A first structure 410, a second structure 420, a second contact 237, a third contact 238, and a fourth contact 239 may be formed in the interlayer insulating film 230.

According to some embodiments, the first structure 410 may include a first lower capacitor connection pattern 231, a first capacitor structure 232, and a first upper capacitor connection pattern 233 sequentially stacked on the first wiring layer 220. The second structure 420 may include a second lower capacitor connection pattern 234, a second capacitor structure 235 and a second upper capacitor connection pattern 236 sequentially stacked on the first wiring layer 220.

Although the image sensor 1 including both the first structure 410 and the second structure 420 is illustrated as an example, the present invention is not limited thereto, and the image sensor 1 may be formed to include only the first structure 410.

According to some embodiments, the first structure 410 and the second structure 420 may be disposed to be spaced apart from each other. In some embodiments, the first lower capacitor connection pattern 231 and the second lower capacitor connection pattern 234 may be formed in parallel on the same level. Accordingly, in some embodiments, a first surface of the first lower capacitor connection pattern 231 facing the substrate 100 and a first surface of the second lower capacitor connection pattern 234 facing the substrate 100 may be coplanar and thus may be at the same level, as illustrated in FIG. 4. Further, a second surface of the first lower capacitor connection pattern 231 facing the second wiring layer 240 and a second surface of the second lower capacitor connection pattern 234 facing the second wiring layer 240 may be coplanar and thus may be at the same level, as illustrated in FIG. 4.

The expression "formed on the same level" may mean formation in the same process step. According to some embodiments, the first capacitor structure 232 may be formed in parallel on the same level as the second capacitor structure 235, the first upper capacitor connection pattern 233 and the second upper capacitor connection pattern 236 may be formed in parallel on the same level. Accordingly, in some embodiments, a first surface of the first capacitor structure 232 facing the substrate 100 and a first surface of the second capacitor structure 235 facing the substrate 100 may be coplanar and thus may be at the same level, as illustrated in FIG. 4. Further, a second surface of the first capacitor structure 232 facing the second wiring layer 240 and a second surface of the second capacitor structure 235 facing the second wiring layer 240 may be coplanar and thus may be at the same level, as illustrated in FIG. 4. In some embodiments, a first surface of the first upper capacitor connection pattern 233 facing the substrate 100 and a first surface of the second upper capacitor connection pattern 236 facing the substrate 100 may be coplanar and thus may be at the same level, as illustrated in FIG. 4. Further, a second surface of the first upper capacitor connection pattern 233 facing the second wiring layer 240 and a second surface of the second upper capacitor connection pattern 236 facing the second wiring layer 240 may be coplanar and thus may be at the same level, as illustrated in FIG. 4.

According to some embodiments, the first lower capacitor connection pattern 231 and the second lower capacitor connection pattern 234 may include, for example, tungsten (W), but the present invention is not limited thereto. Further, according to some embodiments, the first upper capacitor connection pattern 233 and the second upper capacitor connection pattern 236 may include, for example, silicon germanium (SiGe), but the present invention is not limited thereto.

The first capacitor structure 232 may include a first conductive pattern 232a, a first dielectric pattern 232b, and a second conductive pattern 232c sequentially stacked on the first lower capacitor connection pattern 231. Further, the second capacitor structure 235 may include a third conductive pattern 235a, a second dielectric pattern 235b and a fourth conductive pattern 235c sequentially stacked on the second lower capacitor connection pattern 234. According to some embodiments, the first to fourth conductive patterns 232a, 232c, 235a and 235c, the first dielectric pattern 232b, and the second dielectric pattern 232b may include, for example, titanium nitride (TiN), zirconium oxide (ZrO), and/or aluminum oxide (AlO), but the present invention is not limited thereto. As used herein the term "and/or" includes any and all combinations of one or more of the associated listed items.

The second wiring layer 240 may include a plurality of second wirings 241 and 243, and the third wiring layer 250 may include a plurality of third wirings 255. According to some embodiments, the plurality of second wirings 241 and 243 and the third wirings 255 may include metals such as tungsten (W), copper (Cu) and aluminum (Al), but the present invention is not limited thereto. According to some embodiments, the wirings (e.g., the second wirings 241 and 243 and the third wirings 255) included in the second wiring layer 240 and the third wiring layer 250 may be global wirings to which the external voltage (for example, Vc of FIG. 2) is applied.

A first contact 227 for connecting the first wiring 225 and the second lower capacitor connection pattern 234 may be formed in the first wiring layer 220. A second contact 237 for connecting the first lower capacitor connection pattern 231 and the second wiring 241, a third contact 238 for connecting the first upper capacitor connection pattern 233 and the second wiring 243, and a fourth contact 239 for connecting the second upper capacitor connection pattern 236 and the second wiring 243 may be formed inside the second wiring layer 240.

As an example, the first upper capacitor connection pattern 233 and the second upper capacitor connection pattern 236 are illustrated as being connected to the same second wiring 243 in the second wiring layer 240, but the present invention is not limited thereto. For example, the first upper capacitor connection pattern 233 and the second upper capacitor connection pattern 236 may be connected to different wirings, respectively.

According to some embodiments, the first lower capacitor connection pattern 231 may include a capacitor region 231a, and a landing region 231b protruding from the capacitor region 231a. This will be described later with reference to FIG. 5.

The antireflection film 300 may be disposed on the photoelectric conversion layer 110. Specifically, the antireflection film 300 may be disposed conformally on the second surface 100b of the substrate 100 of the sensor array region including the photoelectric conversion layer 110.

The antireflection film 300 may reduce or may possibly prevent reflection of incident light entering the inside of the substrate 100 from the lower surface of the substrate 100. The antireflection film 300 may be formed as a single layer, but as illustrated in FIG. 4, the antireflection film 300 may also be formed as a multi-layers structure including a first sub-antireflection film 301 and a second sub-antireflection film 302.

Specifically, the antireflection film 300 may reduce or may possibly prevent reflection of the incident light, by including a substance having a refractive index between the refractive index of air and the refractive index of the substrate 100. For example, the antireflection film 300 may include silicon oxide, silicon nitride, silicon oxynitride, hafnium oxide, aluminum oxide, tantalum oxide, zirconium oxide, and combinations thereof. However, the present invention is not limited thereto.

For example, on the second surface 100b of the substrate 100 containing silicon, the first sub-antireflection film 301 containing silicon oxide may be formed, and the second sub-antireflection film 302 containing silicon nitride may be formed. Since the refractive index of silicon oxide is about 1.45 to 1.50, the refractive index of silicon nitride is about 1.95 to 2.05, and the refractive index of silicon is about 3.5, it may be possible to reduce or prevent the incident light from being reflected from the top of the substrate 100 by the Snell's law.

The antireflection film 300 may have various thicknesses, materials and the like, depending on the type of incident light.

For example, when $SiO_2$ 1600 Å, SiON 80 Å and SiN 400 Å are sequentially formed as the antireflection film 300 on the second surface 100b of the substrate 100, visible light of approximately 450 nm to 550 nm may be well transmitted. Further, for example, when $SiO_2$ 600 Å, SiON 1500 Å and SiN 200 Å are sequentially formed as the antireflection film 300 on the second surface 100b of the substrate 100, visible light of about 520 nm or more may be well transmitted.

The color filter layer 310 may include red, green, or blue color filters according to the unit pixel 11. The color filters may be two-dimensionally arranged, and may include a yellow filter, a magenta filter, and a cyan filter. In addition, the color filter layer 310 may further include a white filter.

However, in some embodiments, the image sensor 1 may not include the color filter layer 310.

The grid pattern 320 may be disposed on the substrate 100. For example, the grid pattern 320 may be formed on the antireflection film 300. The grid pattern 320 may reflect incident light obliquely incident on the substrate 100 and may provide more incident light to the photoelectric conversion layer 110. However, in some embodiments, the image sensor 1 may not include the grid pattern 320.

The microlens 330 may be disposed on the antireflection film 300. Specifically, the microlens 330 may be disposed on the color filter layer 310 on the antireflection film 300. The microlens 330 has a convex shape, and may have a predetermined curvature radius. Therefore, the microlens 330 may condense the incident light on the photoelectric conversion layer 110. The microlens 330 may include, for example, a light-transmitting resin, but the present invention is not limited thereto.

Figure 5:
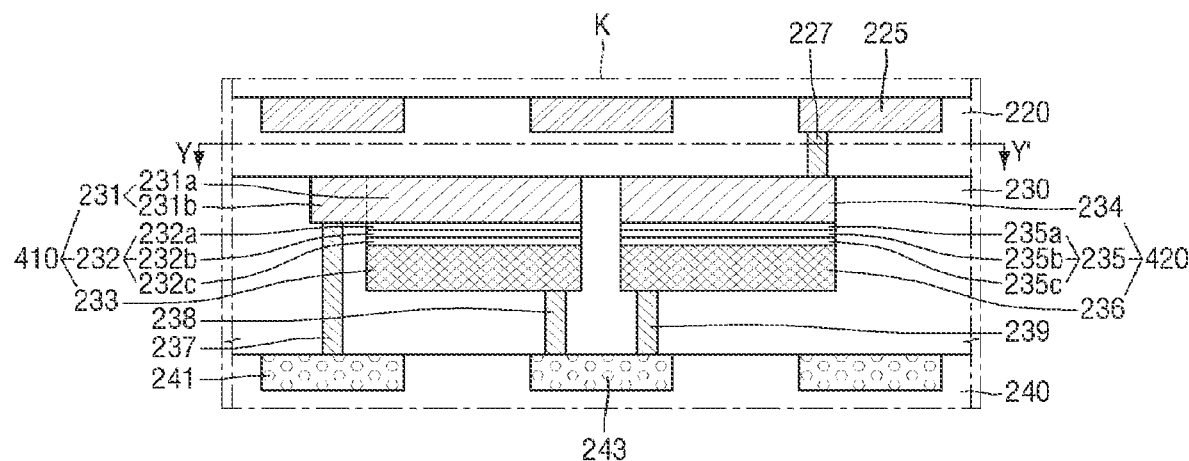
FIG. 5 is an enlarged view of a region K of FIG. 4.

FIG. 5 is an enlarged view of a cross section of a region K of FIG. 4. Hereinafter, a landing region 231b formed to protrude from the capacitor region 231a according to some embodiments of the present invention, and a structure in which the landing region 231b is connected to the second wiring 241 via the second contact 237 will be described referring to FIG. 5.

As illustrated in FIG. 5, the first lower capacitor connection pattern 231 in the interlayer insulating film 230 may include the capacitor region 231a, and the landing region 231b formed to protrude from the capacitor region 231a. The first lower capacitor connection pattern 231 may be exposed from the second wiring 241 due to the landing region 231b formed to protrude from the capacitor region 231a, and the first lower capacitor connection pattern 231 and the second wiring 241 may be connected via the second contact 237. In some embodiments, the first capacitor structure 232 and the first upper capacitor connection pattern 233 may not be formed on the landing region 231b such that only the interlayer insulating film 230 may be interposed between the landing region 231b and the second wiring 241, as illustrated in FIG. 5.

The image sensor 1 according to some embodiments of the present invention may include a first structure 410 and a second structure 420 that is spaced apart from the first structure 410. The first structure 410 may be disposed on the first surface 100a of the substrate 100 and may include a first lower capacitor connection pattern 231 including a capacitor region 231a and a landing region 231b protruding from the capacitor region 231a and a first capacitor structure 232. The second structure 420 may include a second lower capacitor connection pattern 234 and a second capacitor structure 235, which are formed on the same level as the first lower capacitor connection pattern 231 and the first capacitor structure 232, respectively. The image sensor 1 may also include a second wiring 241 that is disposed on the first structure 410 and is connected to the landing region 231b and a second wiring 243 that is disposed on the first structure 410 and the second structure 420 and is connected to both the first capacitor structure 232 and the second capacitor structure 235. At this time, the first capacitor structure 232 may include a first conductive pattern 232a, a first dielectric pattern 232b, and a second conductive pattern 232c, and the second capacitor structure 235 may include a third conductive pattern 235a, a second dielectric pattern 235b, and a fourth conductive pattern 235c.

According to some embodiments, the image sensor 1 may further include a second contact 237 which connects the landing region 231b and the second wiring 241, and a third contact 238 which connects the second lower capacitor connection pattern 234 and the second wiring 243.

In some embodiments, the image sensor 1 may further include a first wiring 225 which is disposed between the first surface of the substrate 100 and the second structure 420 and is connected to the second lower capacitor connection pattern 234.

As illustrated in FIG. 5, in some embodiments, the landing region 231b may be formed at the same level as the capacitor region 231a, may be arranged to be in contact with the capacitor region 231a, and may be formed to protrude beyond one ends of each of the first conductive pattern 232a, the first dielectric pattern 232b and the second conductive pattern 232c. A first surface of the landing region 231b facing the substrate 100 and a first surface of the capacitor region 231a facing the substrate 100 may be coplanar and thus may be at the same level, as illustrated in FIG. 5. Further, a second surface of the landing region 231b opposite the first surface thereof and a second surface of the capacitor region 231a opposite the first surface thereof may be coplanar and thus may be at the same level, as illustrated in FIG. 5.

Further, as illustrated in FIG. 5, in some embodiments, the first structure 410 may further include a first upper capacitor connection pattern 233 disposed on the first capacitor structure 232, and a second upper capacitor connection pattern 236 disposed on the second capacitor structure 235.

When the landing region 231b protruding from the capacitor region 231a is not formed, in order to connect the first lower capacitor connection pattern 231 and the second wirings 241 and 243 in the second wiring layer 240, it may be necessary to connect the capacitor region 231a and the wiring in the first wiring layer 220 via a separate contact and to connect the wiring of the first wiring layer 220 and the wiring of the second wiring layer 240 via another contact. Accordingly, a lot of loss occurs due to the resistance generated in a path such as the wiring and the contact, and the resistance between the first lower capacitor connection pattern 231 and the second wirings 241 and 243 may increase.

In particular, the wiring and the contact made of tungsten (W) having a high electrical resistivity are frequently used, and thus in order to reduce the resistance, a scheme that may reduce a length of a path for the electrical connection may be beneficial. By providing the landing region 231b protruding from the capacitor region 231a in an image sensor according to the embodiment of the present invention, it is possible to connect the landing region 231b to a wiring located adjacent to the opposite electrode without going through a plurality of wiring layers, thereby reducing or possibly minimizing the loss due to resistance.

Figure 6:
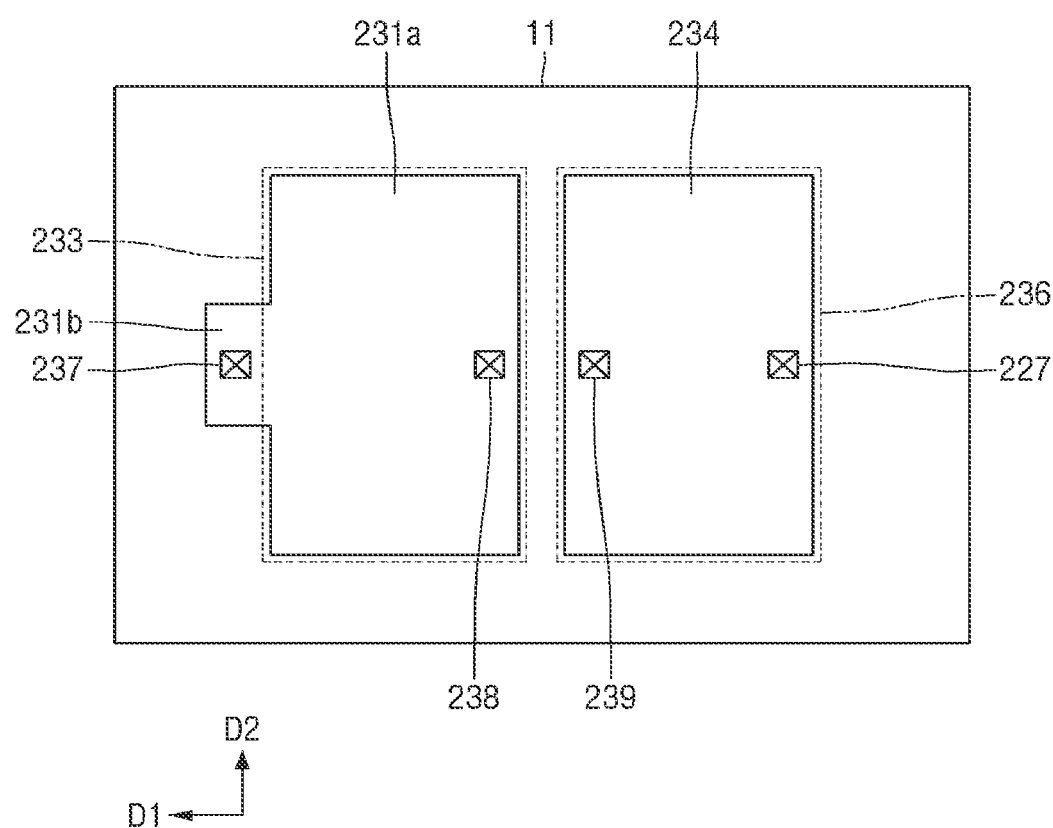
FIG. 6 illustrates a layout viewed in a direction of an arrow in a cross section taken along line Y-Y' of FIG. 5.

FIG. 6 illustrates a layout viewed in the direction of the arrow in the cross section taken along line Y-Y' of FIG. 5.

Referring to FIG. 6, the image sensor 1 according to some embodiments of the present invention may include a first lower capacitor connection pattern 231 including a capacitor region 231a and a landing region 231b extending from one side wall of the capacitor region 231a in a first direction (e.g., a direction D1 in FIG. 6) in plan view on the first surface 100a of the substrate 100, a first capacitor structure 232 on the capacitor region 231a, and a second wiring 241 formed on the second wiring layer 240 on the first capacitor structure 232 and connected to the landing region 231b. In plan view, the landing region 231b may have a width in a second direction (e.g., a direction D2 in FIG. 6) less than a width of the capacitor region 231a in the second direction and may protrude from a portion of the one side wall of the capacitor region 231a, as illustrated in FIG. 6. Referring to FIG. 6, in some embodiments, the landing region 231b may contact the portion of the one side wall of the capacitor region 231a.

According to some embodiments, the image sensor 1 may further include a first upper capacitor connection pattern 233 formed on the first capacitor structure 232.

As illustrated in FIG. 6, the first lower capacitor connection pattern 231 may include a landing region 231b and a capacitor region 231a, and particularly the landing region 231b may be formed to protrude from a part of one side wall of the capacitor region 231a.

The landing region 231b protruding from a part of one side wall of the capacitor region 231a may be connected to the second wiring 241 formed on the second wiring layer 240. That is, since the landing pad (e.g., the landing region 231b) is exposed from the first upper capacitor connection pattern 233 without being covered and is connected to the second wiring (e.g., the second wiring 241), the first lower capacitor connection pattern 231 and the global wiring (e.g., the second wiring 241) may be connected without going through the first wiring layer 220.

Although FIG. 6 illustrates that the two structures, that is, the first structure 410 and the second structure 420 are formed on an unit pixels 11, this is for convenience of explanation, and the present invention may, of course, be applied to an image sensor in which only the first structure 410 is formed.

Also, for convenience of illustration, the first upper capacitor connection pattern 233 and the second upper capacitor connection pattern 236 are illustrated slightly bigger than the capacitor region 231a of the first lower capacitor connection pattern 231 and the second lower capacitor connection pattern 234, respectively, in FIG. 6. However, it will be understood that the first upper capacitor connection pattern 233 and the capacitor region 231a of the first lower capacitor connection pattern 231 can be formed to have the same size in plan view, and the second upper capacitor connection pattern 236 and the second lower capacitor connection pattern 234 can be formed to have the same size in plan view.

FIGS. 7 to 16 are cross-sectional views of intermediate steps illustrating a method for fabricating an image sensor according to some embodiments of the present invention. For simplicity of explanation, repeated parts of contents described with reference to FIGS. 1 to 6 will be briefly described or omitted. Although the method for fabricating the image sensor having two capacitors will be described as an example, the present invention is not limited thereto but may also be applied to an image sensor having a single capacitor.

Figure 7:
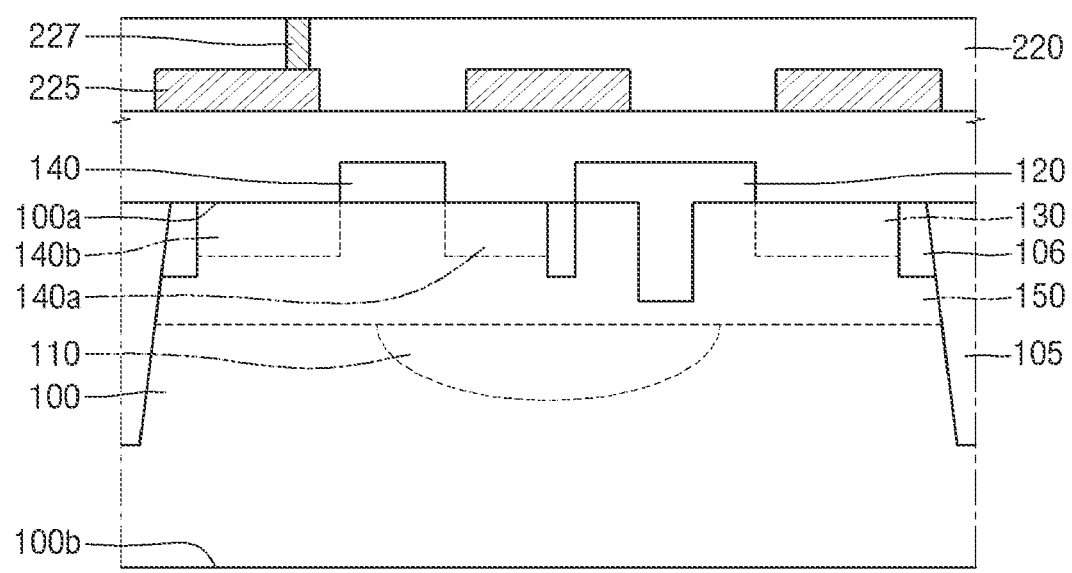
FIGS. 7 to 16 are cross-sectional views of intermediate steps illustrating a method for fabricating an image sensor according to some embodiments of the present invention.

Referring to FIG. 7, the first wiring layer 220 may be formed on the first surface 100a of the substrate 100. According to some embodiments, the first wiring layer 220 may be formed by filling the insulating material that covers the first wiring 225 and the first contact 227. It will be understood that "an element A covers an element B" (or similar language) may means that the element A is on the element B but does not necessarily mean that the element A covers the element B entirely.

Figure 8:
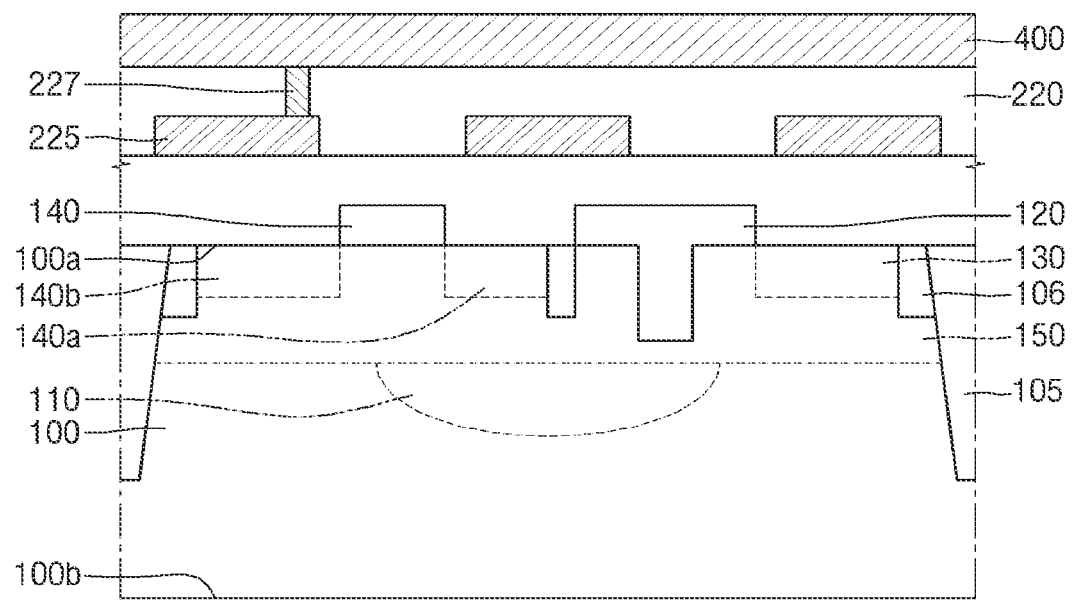

Referring to FIG. 8, a pattern 400 for forming the first lower capacitor connection pattern 231 and the second lower capacitor connection pattern 234 may be deposited on the first wiring layer 220.

The pattern 400 may include metals such as tungsten (W), copper (Cu), and aluminum (Al), but the present invention is not limited thereto.

Figure 9:
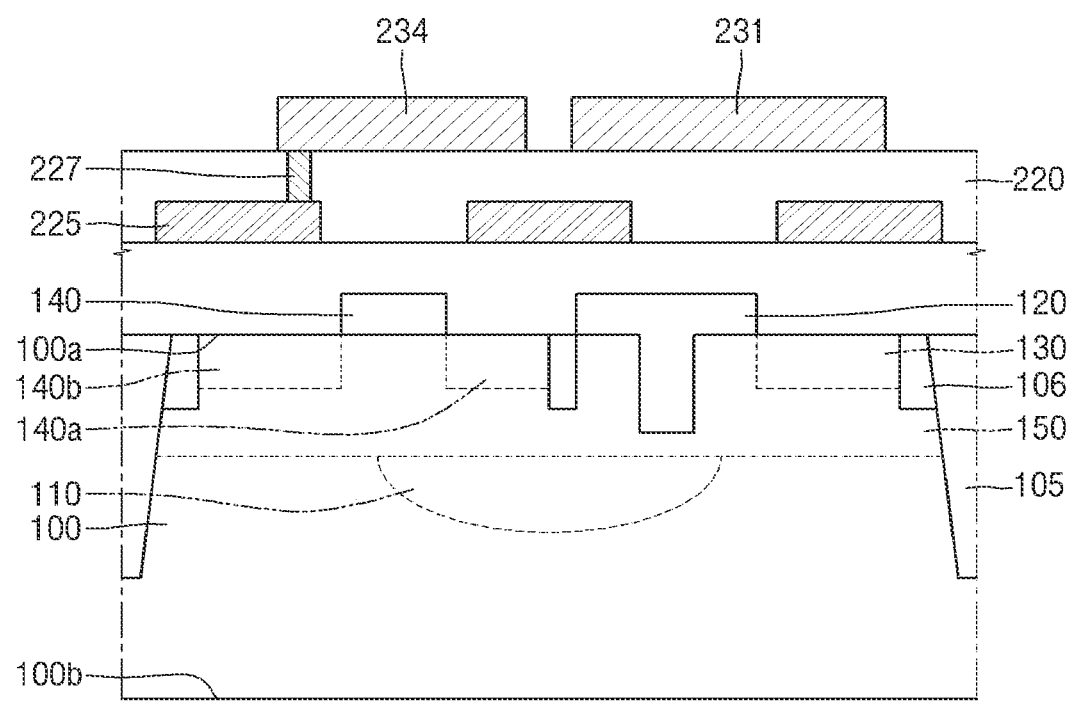

Referring to FIG. 9, the first lower capacitor connection pattern 231 and the second lower capacitor connection pattern 234 may be formed on the first wiring layer 220.

According to some embodiments, the first lower capacitor connection pattern 231 and the second lower capacitor connection pattern 234 may be patterned by etching the pattern 400, and the second lower capacitor connection pattern 234 may be connected to the first wiring 225 in the first wiring layer 220.

Figure 10:
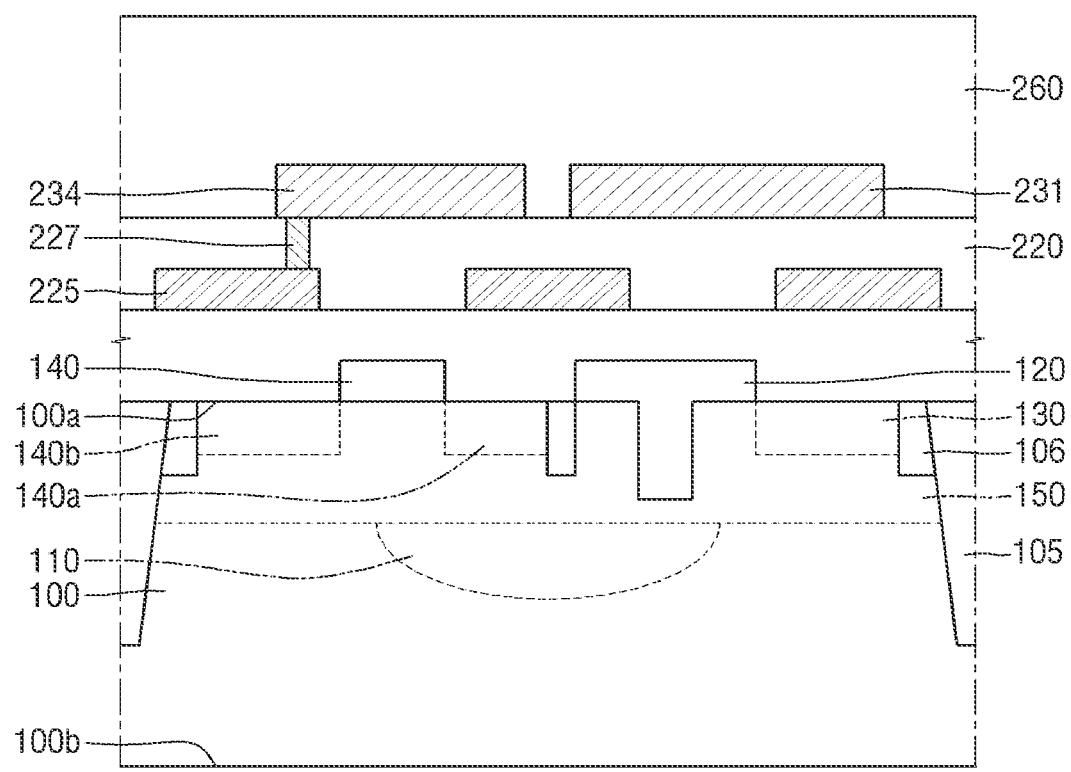

Referring to FIG. 10, in order to form the interlayer insulating film 230, a dielectric film 260 which covers the first lower capacitor connection pattern 231 and the second lower capacitor connection pattern 234 may be stacked.

The dielectric film 260 may be, for example, TEOS (tetraethyl ortho silicate), but the present invention is not limited thereto, and the dielectric film 260 may include, for example, silicon nitride ($Si_3N_4$), silicon oxide ($SiO_2$), silicon oxynitride (SiON), nanoporous silica, HSQ (hydrogensilsesquioxanes), Teflon-AF (polytetrafluorethylene or PTFE), FSG (silicon oxyfluoride), carbon doped $SiO_2$ (SiCO), SiCOH (hydrogenated silicon oxycarbide) or other low dielectric constant (low k) or ultra-low k (ULK) dielectric materials. The ultra-low k dielectric material may be a dielectric material having a dielectric constant of about 2.5 or lower.

Figure 11:
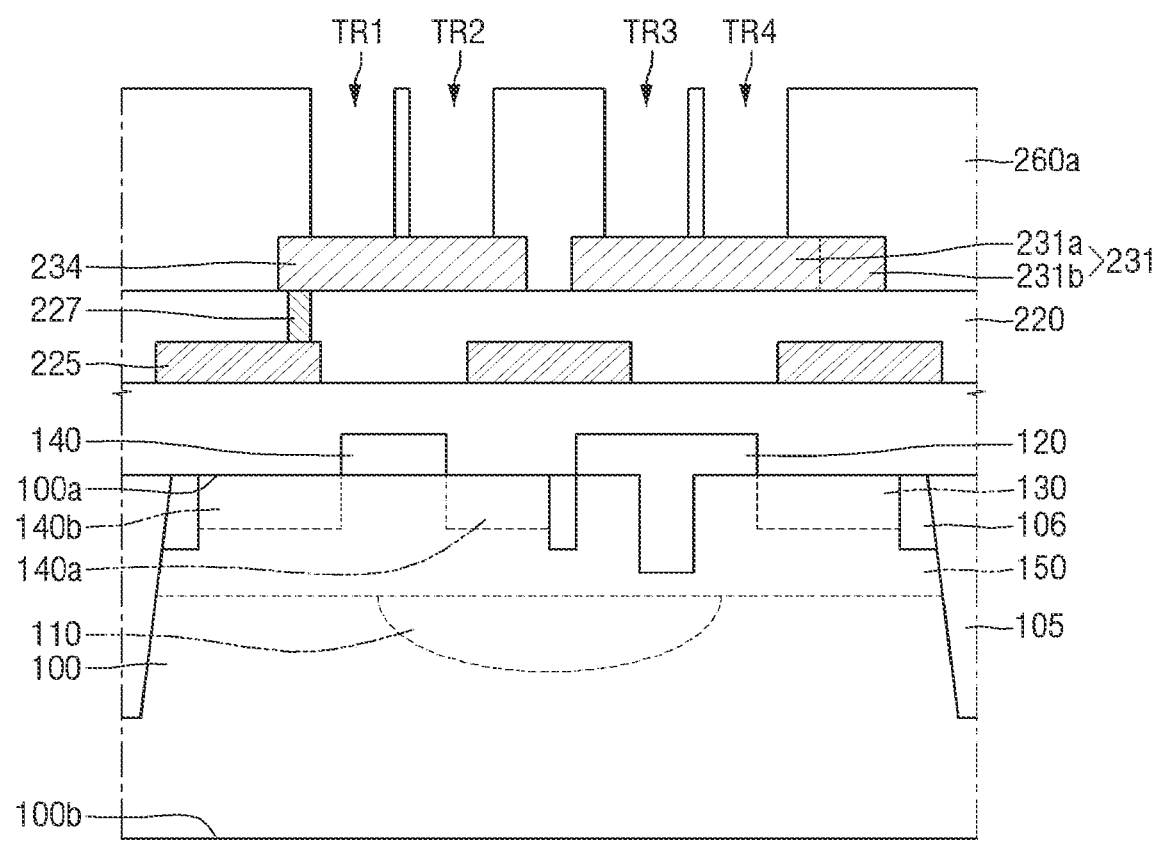

Referring to FIG. 11, the dielectric film 260 may be patterned to expose some parts of the upper surfaces of the first lower capacitor connection pattern 231 and the second lower capacitor connection pattern 234.

For example, a mask pattern (not illustrated) which exposes a part of the upper surface of the dielectric film 260 may be formed on the dielectric film 260. Subsequently, an etching process using the mask pattern as an etching mask may be performed. The etching process may be performed until the upper surface of the first lower capacitor connection pattern 231 or the second lower capacitor connection pattern 234 is exposed. Thus, trenches TR1, TR2, TR3 and TR4 which expose a part of the upper surface of the first lower capacitor connection pattern 231 or the second lower capacitor connection pattern 234 may be formed in a non-etched dielectric film 260a. After the trenches TR1, TR2, TR3 and TR4 are formed, the mask pattern may be removed.

Figure 12:
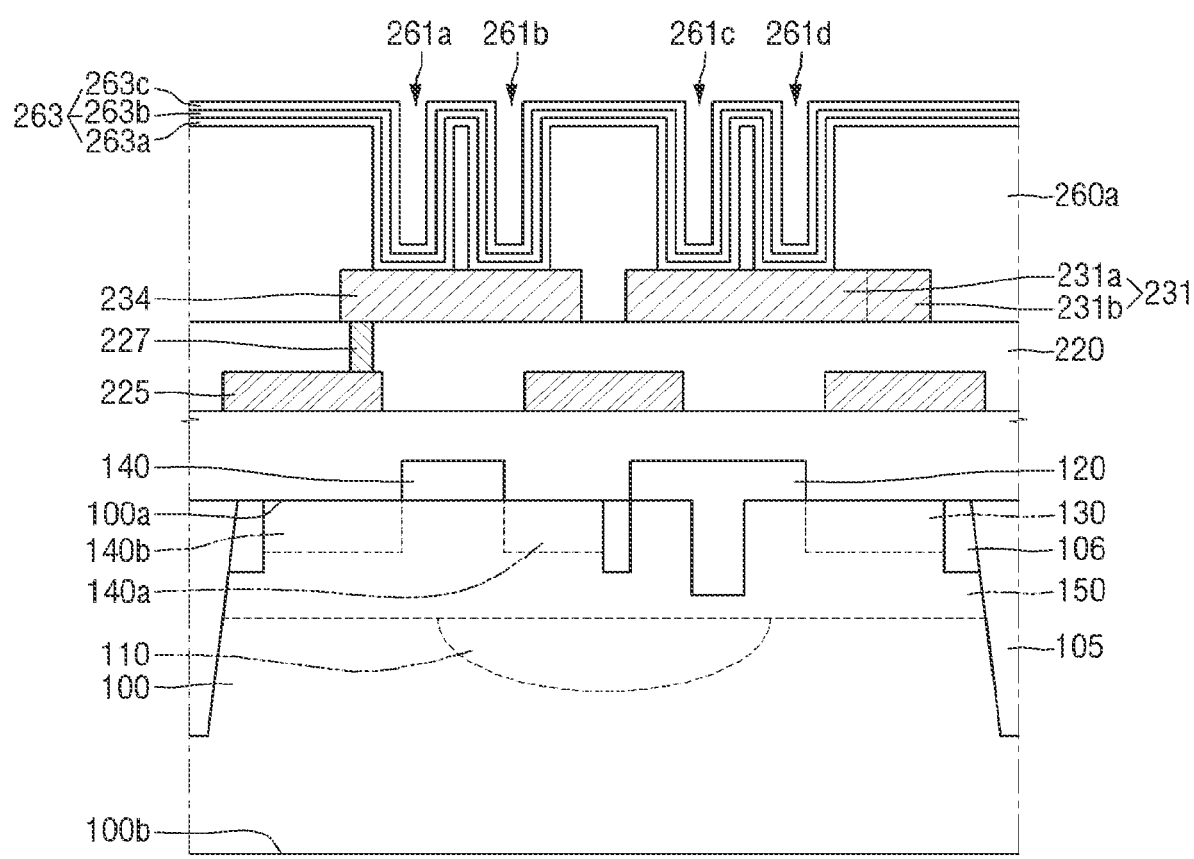

Referring to FIG. 12, a capacitor structure 263 may be formed by depositing a conductive film 263a, a dielectric film 263b and a conductive film 263c.

As illustrated in FIG. 12, the conductive film 263a, the dielectric film 263b and the conductive film 263c may be sequentially deposited on the surfaces of the first lower capacitor connection pattern 231 and the second lower capacitor connection pattern 234 exposed by the non-etched dielectric film 260a and the trenches TR1, TR2, TR3 and TR4. The regions 261a, 261b, 261c and 261d in which the conductive film 263a, the dielectric film 263b and the conductive film 263c are not deposited in the trenches TR1, TR2, TR3 and TR4 may be empty regions.

According to some embodiments, the conductive film 263a may be formed by depositing S—TiN, the dielectric film 263b may be formed by depositing ZrO, and the conductive film 263c may be formed by depositing P—TiN, but the present invention is not limited thereto.

Figure 13:
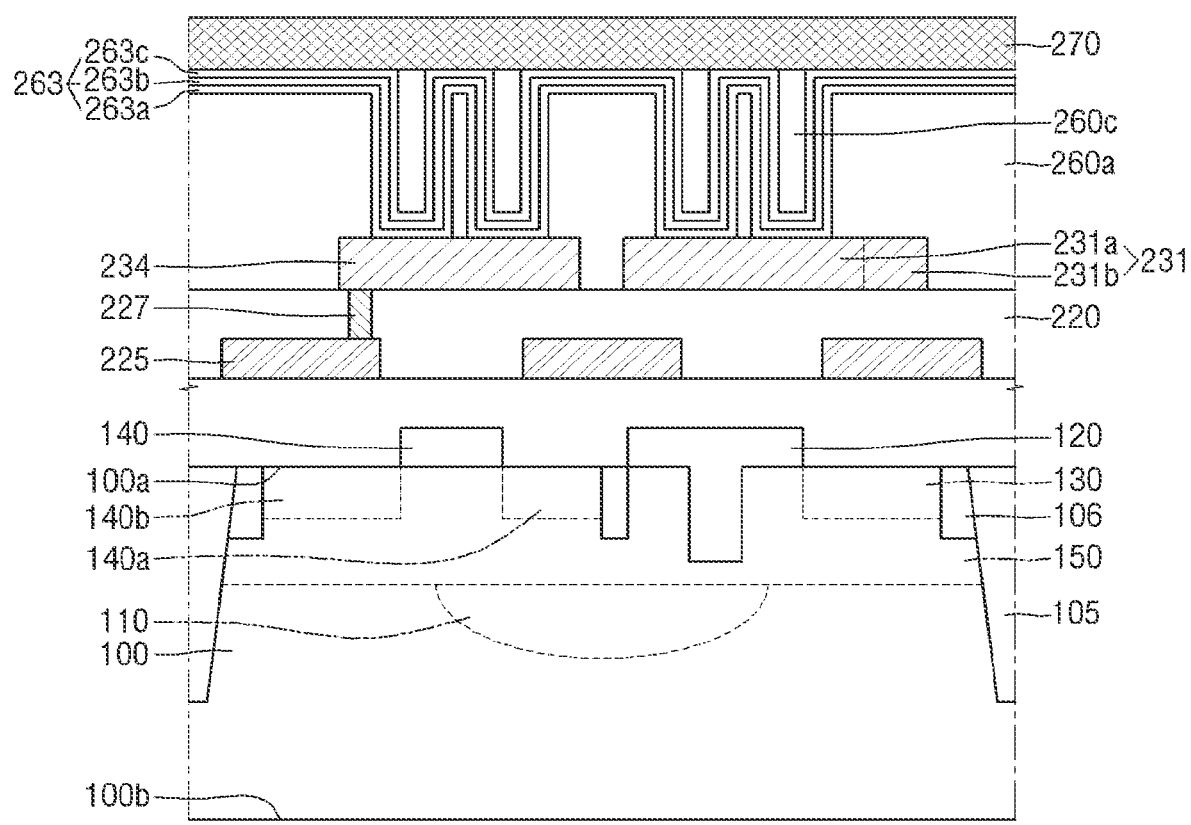

Referring to FIG. 13, a pattern 270 for forming the first upper capacitor connection pattern 233 and the second upper capacitor connection pattern 236 may be deposited on the capacitor structure 263.

The pattern 270 may include, for example, silicon germanium (SiGe), but the present invention is not limited thereto.

Figure 14:
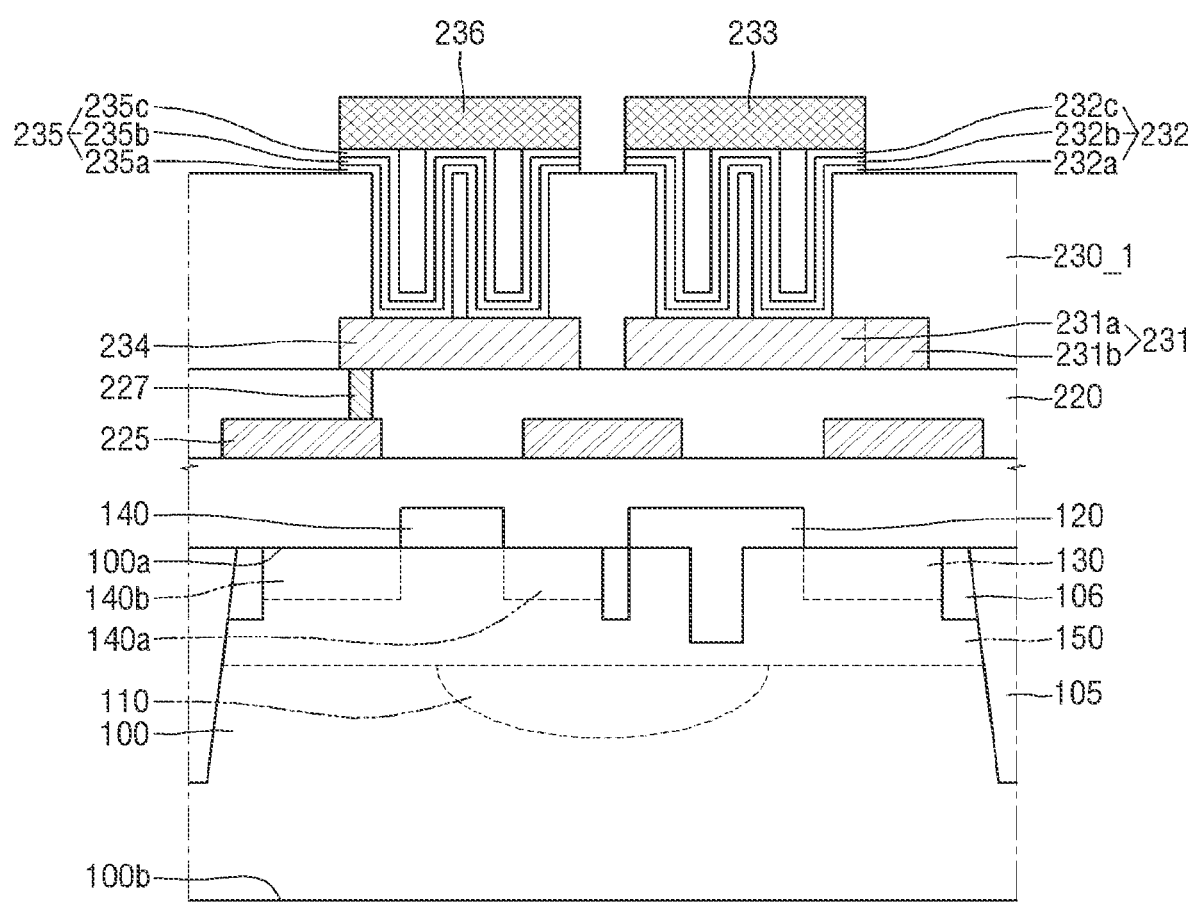

Referring to FIG. 14, the first upper capacitor connection pattern 233 and the second upper capacitor connection pattern 236 may be patterned through the etching process of the pattern 270. In addition, the first capacitor structure 232 and the second capacitor structure 235 may be patterned through the etching process of the capacitor structure 263.

As illustrated in FIG. 14, the first structure 410 including the first lower capacitor connection pattern 231, the first capacitor structure 232 and the first upper capacitor connection pattern 233 is formed through the etching process of the pattern 270, and the second structure 420 including the second lower capacitor connection pattern 234, the second capacitor structure 235 and the second upper capacitor connection pattern 236 is formed.

Figure 15:
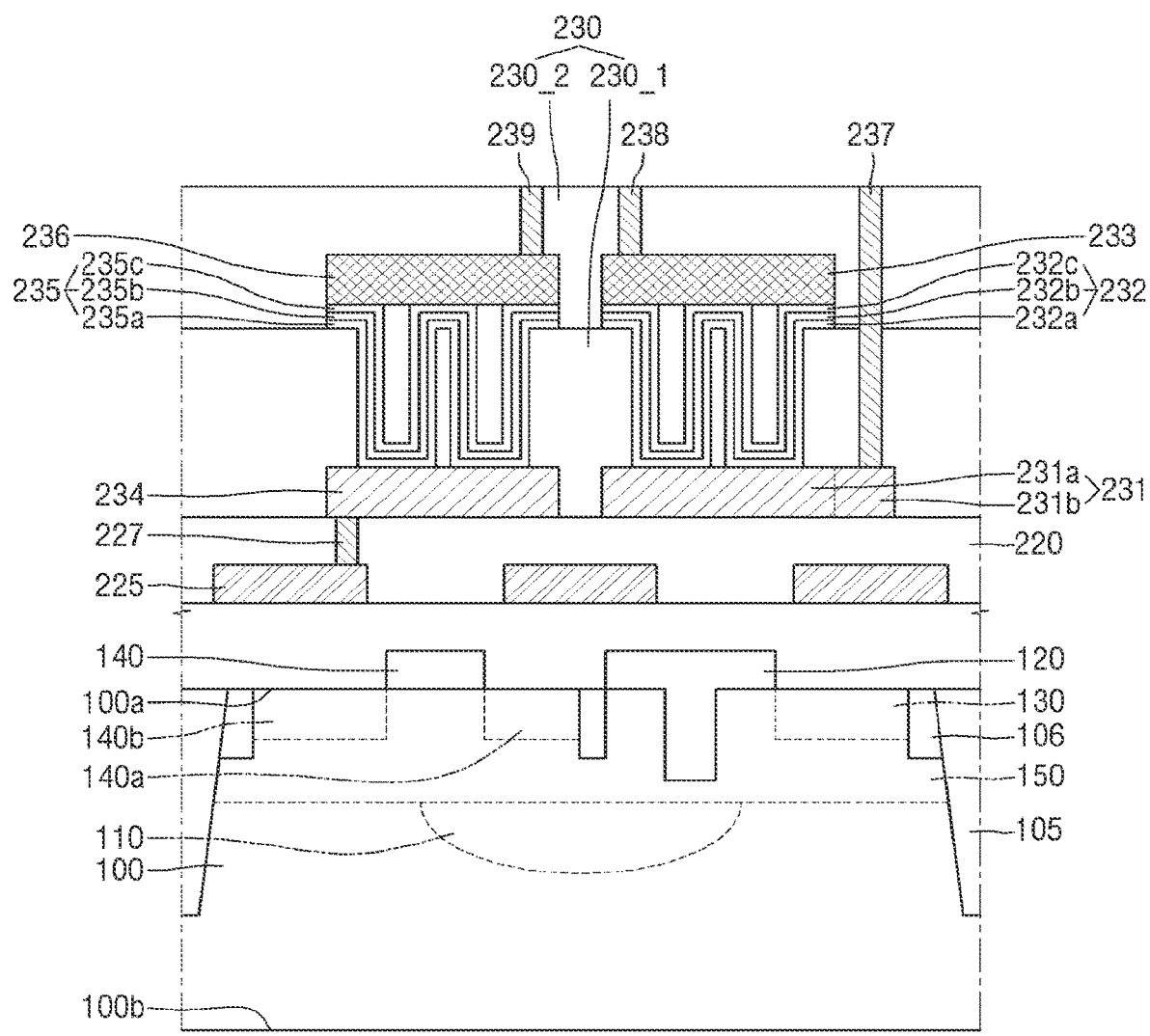

Referring to FIG. 15, a second contact 237 connected to the landing region 231b, a third contact 238 connected to the first upper capacitor connection pattern 233, and a fourth contact 239 connected to the second upper capacitor connection pattern 236 may be formed.

A dielectric film 230_1 exposed by the etching of the dielectric film 260, and a dielectric film 230_2 covering the first upper capacitor connection pattern 233 and the second upper capacitor connection pattern 236 may be stacked to form the interlayer insulating film 230.

Subsequently, trenches (not illustrated) is formed by patterning the interlayer insulating film 230, and a metal material may be stacked on the formed trenches to form a second contact 237, a third contact 238 and a fourth contact 239. The metal material for forming the second contact 237, the third contact 238, and the fourth contact 239 may be, for example, tungsten (W), but the present invention is not limited thereto.

Figure 16:
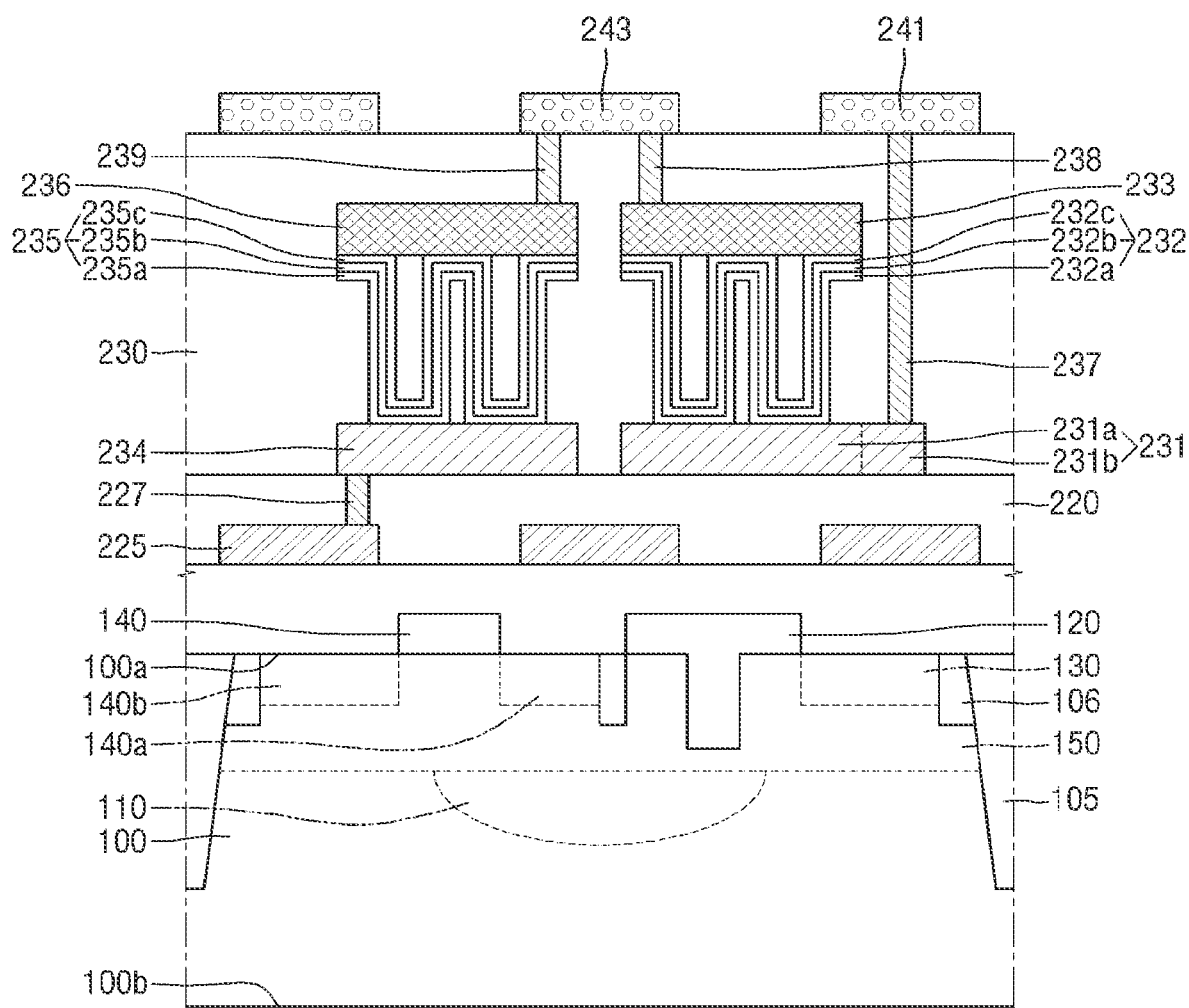

Referring to FIG. 16, the second wirings 241 and 243 may be formed on the interlayer insulating film 230.

The second wirings 241 and 243 may be patterned by stacking a metal pattern on the interlayer insulating film 230 and etching the metal pattern. As illustrated in FIG. 16, the second wiring 241 may be connected to the landing region 231b of the first lower capacitor connection pattern 231 through the second contact 237. Further, the second wiring 243 may be connected to the first upper capacitor connection pattern 233 through the third contact 238, and may be connected to the second upper capacitor connection pattern 236 through the fourth contact 239.

As an example, the first upper capacitor connection pattern 233 and the second upper capacitor connection pattern 236 are illustrated as being connected to the same wiring 243, but this is an example, and the present invention may include a configuration in which the first upper capacitor connection pattern 233 and the second upper capacitor connection pattern 236 are connected to different wirings.

Figure 17:
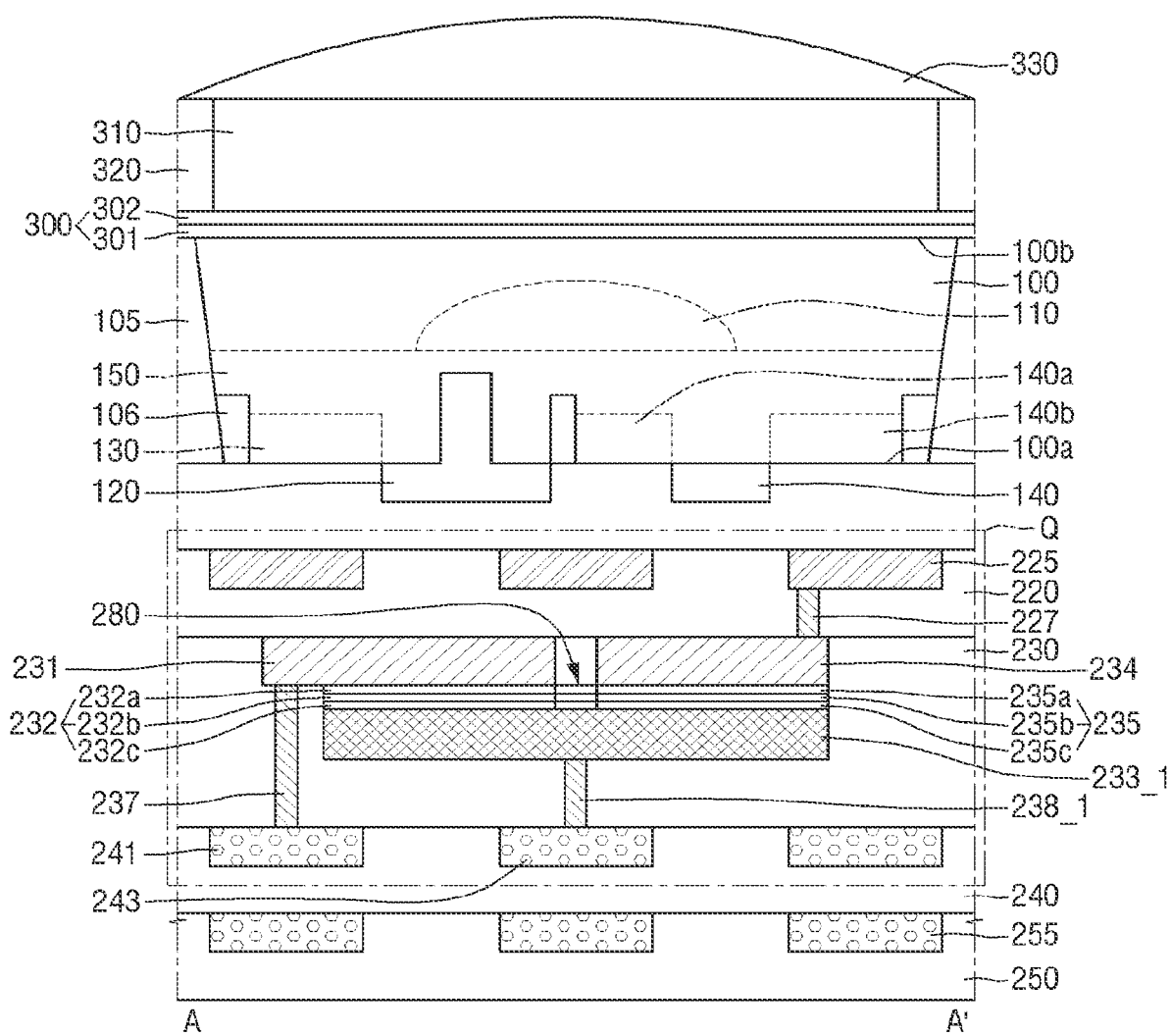
FIG. 17 is a cross-sectional view taken along line A-A' of FIG. 3 according to some embodiments of the present invention.
Figure 18:
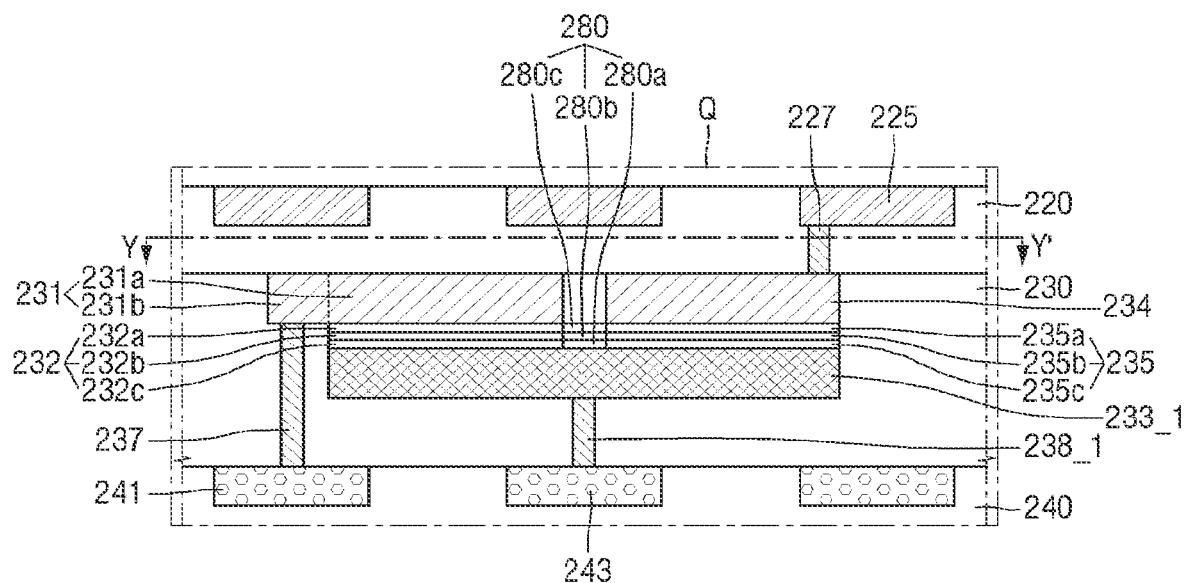
FIG. 18 is an enlarged view of a region Q of FIG. 17.

FIG. 17 is a cross-sectional view taken along the line A-A' of FIG. 3 according to some embodiments of the present invention, and FIG. 18 is an enlarged view of a region Q of FIG. 17. Hereinafter, an image sensor sharing the upper capacitor connection pattern will be described with reference to FIGS. 17 and 18. For simplicity of explanation, repeated parts of contents described with reference to FIGS. 1 to 16 will be simply explained or omitted.

Referring to the circuit illustrated in FIG. 2, one end of the first capacitor C1 and one end of the second capacitor C2 may be connected at the X node. Hereinafter, the second wiring 243 is assumed to be connected to the X node.

As illustrated in the region Q of FIGS. 17 and 18, the interlayer insulating film 230 may include a first lower capacitor connection pattern 231, a first capacitor structure 232, a second lower capacitor connection pattern 234, a second capacitor structure 235 and an upper capacitor connection pattern 233_1. That is, the upper capacitor connection pattern 233_1 may be connected to the second wiring 243 connected to the X node.

In fabricating two capacitors connected to the same node, it is possible to share the electrodes connected to the same node, thereby reducing the process complexity, and by forming a region (e.g., the landing region 231b of FIG. 18) extending from the unshared electrodes, a region exposed from the separated wiring layer may be provided, thereby simplifying the wiring path. Further, as the wiring path is simplified, it is possible to allow an efficient connection by reducing or possibly minimizing the resistance generated in the wiring made of the conductive material.

In some embodiments, as illustrated in FIG. 18, the image sensor may include a capacitor structure 280 including a conductive film 280a, a dielectric film 280b and a conductive film 280c between the first capacitor structure 232 and the second capacitor structure 235. The capacitor structure 280 may be connected to the first capacitor structure 232 and the second capacitor structure 235.

Figure 19:
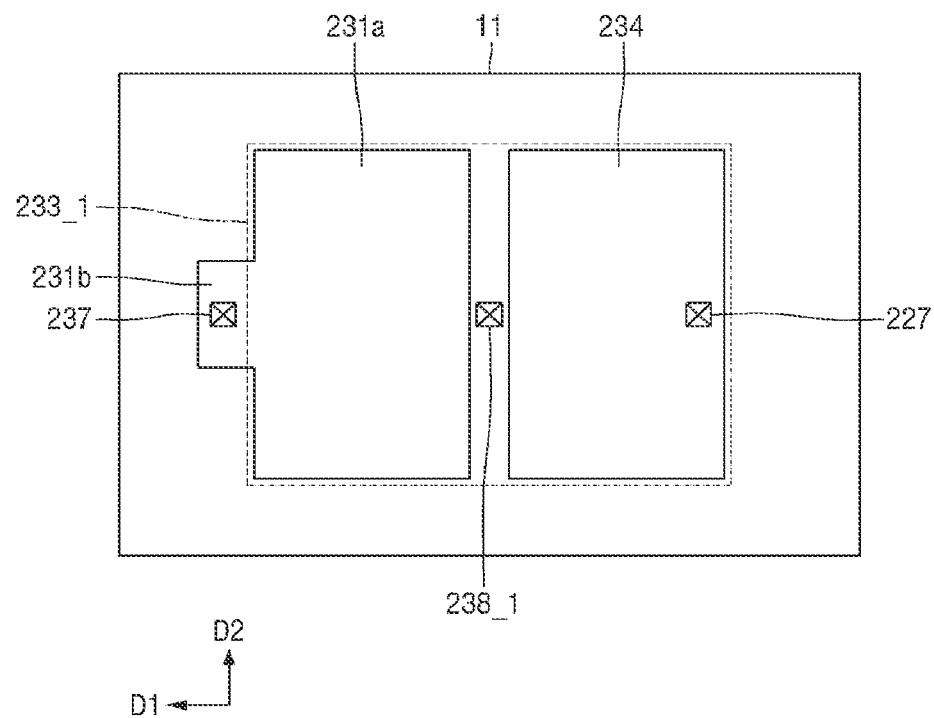
FIG. 19 illustrates a layout viewed in the direction of the arrow in the cross section taken along line Y-Y' of FIG. 18.

FIG. 19 illustrates a layout viewed in a direction of an arrow in the cross section taken along line Y-Y' of FIG. 18.

Referring to FIGS. 18 and 19, the image sensor 1 according to some embodiments of the present invention may include a first lower capacitor connection pattern 231 including a capacitor region 231a and a landing region 231b extending in a first direction (e.g., a direction D1 in FIG. 19) from one side wall of the capacitor region 231a in plan view on the first surface 100a of the substrate 100, and the landing region 231b may protrude from a portion of the one side wall of the capacitor region 231a in plan view. The image sensor 1 may also include a first capacitor structure 232 on the capacitor region 231a and a second wiring 241 formed on the second wiring layer 240 on the first capacitor structure 232 and connected to the landing region 231b. In plan view, the landing region 231b may have a width in a second direction (e.g., a direction D2 in FIG. 19) less than a width of the capacitor region 231a in the second direction and contact the portion of the one side wall of the capacitor region 231a.

As illustrated in FIGS. 18 and 19, according to some embodiments, the image sensor 1 may further include a second lower capacitor connection pattern 234 formed at the same level as the first lower capacitor connection pattern 231 and disposed to be spaced apart from the first lower capacitor connection pattern 231, a second capacitor structure 235 on the second lower capacitor connection pattern 234, and an upper capacitor connection pattern 233_1 disposed on the first capacitor structure 232 and the second capacitor structure 235 and connected to the second wiring 243 via the contact 238_1. It will be understood that the upper capacitor connection pattern 233_1 may be referred to as a common upper capacitor connection pattern as the upper capacitor connection pattern 233_1 is on both the first capacitor structure 232 and the second capacitor structure 235. In some embodiments, a first surface of the first lower capacitor connection pattern 231 facing the first wiring layer 220 and a first surface of the second lower capacitor connection pattern 234 facing the first wiring layer 220 may be coplanar and thus may be at the same level, as illustrated in FIG. 18. Further, a second surface of the first lower capacitor connection pattern 231 opposite the first surface thereof and a second surface of the second lower capacitor connection pattern 234 opposite the first surface thereof may be coplanar and thus may be at the same level, as illustrated in FIG. 18.

As illustrated in FIG. 19, the first lower capacitor connection pattern 231 may include a landing region 231b and a capacitor region 231a, and the landing region 231b may be formed to protrude from a part of the one side wall of the capacitor region 231a.

The landing region 231b protruding from a part of the one side wall of the capacitor region 231a may be connected to the second wiring 241 formed on the second wiring layer 240. That is, since the landing pad (e.g., the landing region 231b) is exposed from the upper capacitor connection pattern 233_1 without being covered and is connected to the second wiring (e.g., the second wiring 241), the first lower capacitor connection pattern 231 and a global wiring (e.g., the second wiring 241) may be connected without passing through the first wiring layer 220.

Although FIG. 19 shows both the first lower capacitor connection pattern 231 and the second lower capacitor connection pattern 234 formed on the unit pixel 11, it will be understood that the present invention may also be applied to an image sensor in which only the first lower capacitor connection pattern 231 is formed.

Further, for convenience of illustration, the upper capacitor connection pattern 233_1 is illustrated slightly bigger than the capacitor region 231a of the first lower capacitor connection pattern 231 and the second lower capacitor connection pattern 234 in FIG. 19. However, it will be understood that the upper capacitor connection pattern 233_1 may be formed to have the same size of the capacitor region 231a of the first lower capacitor connection pattern 231 and the second lower capacitor connection pattern 234 on the layout.

Figure 20:
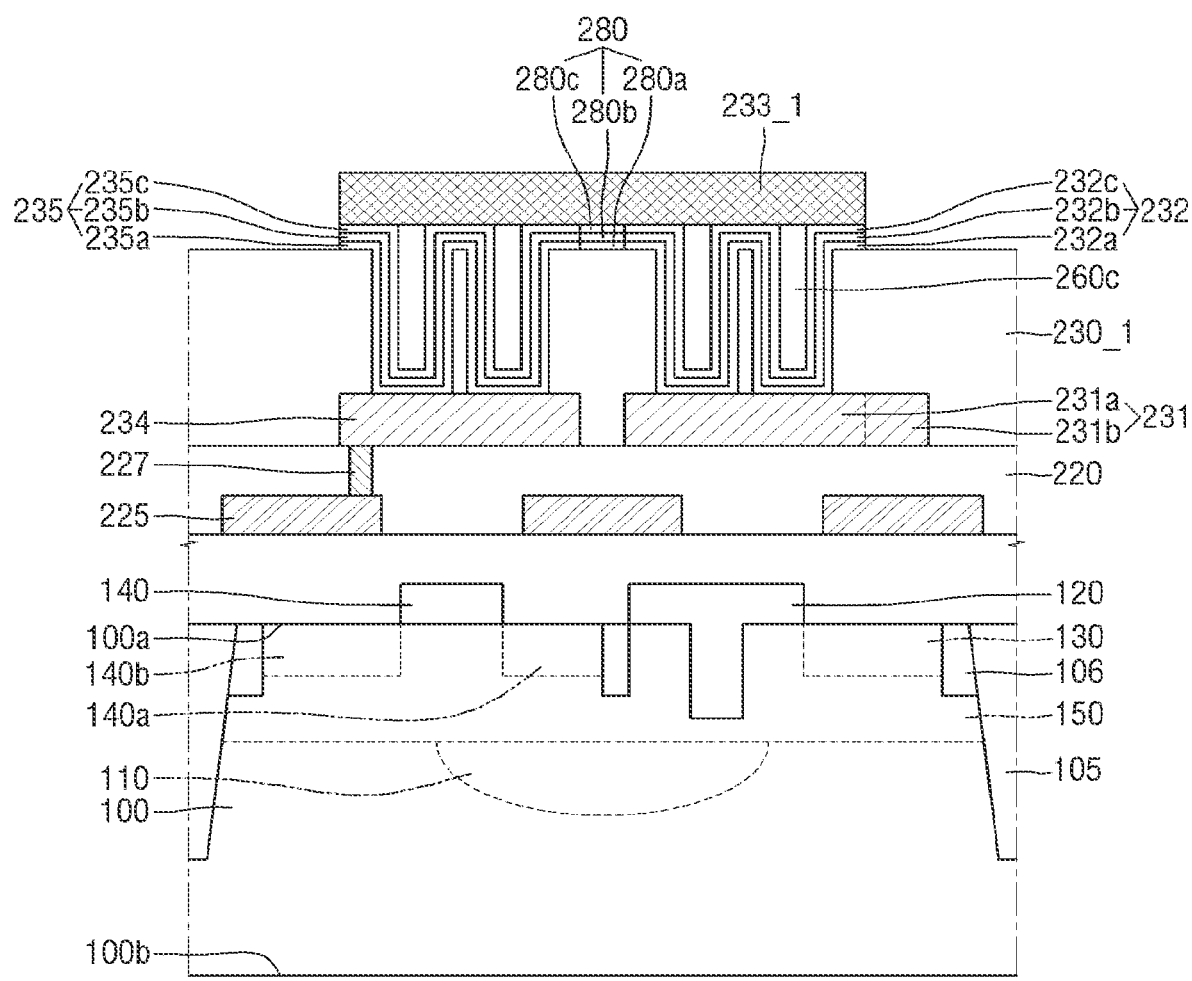
FIGS. 20 to 22 are cross-sectional views of intermediate steps illustrating a method for fabricating an image sensor according to some embodiments of the present invention.
Figure 21:
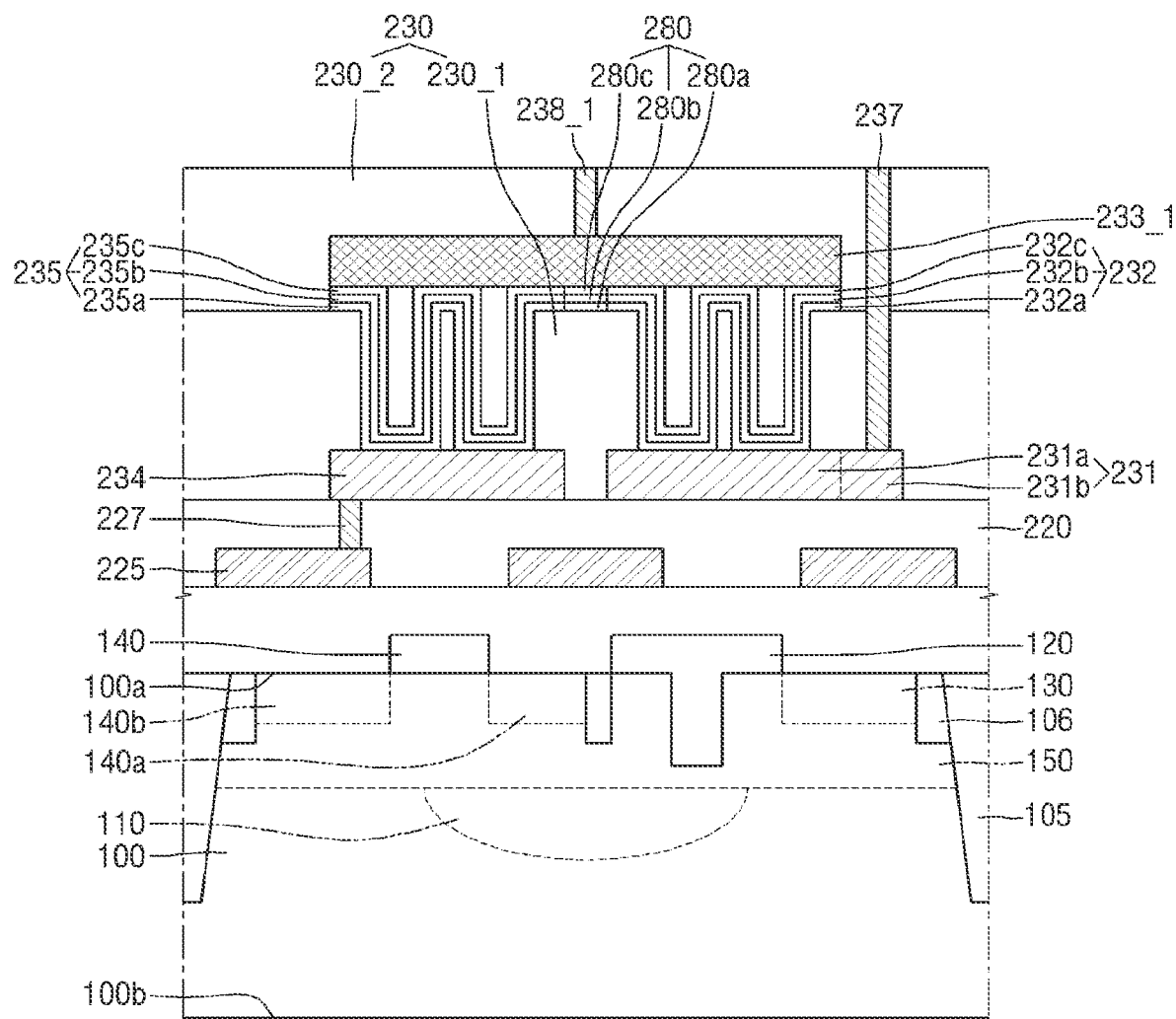
Figure 22:
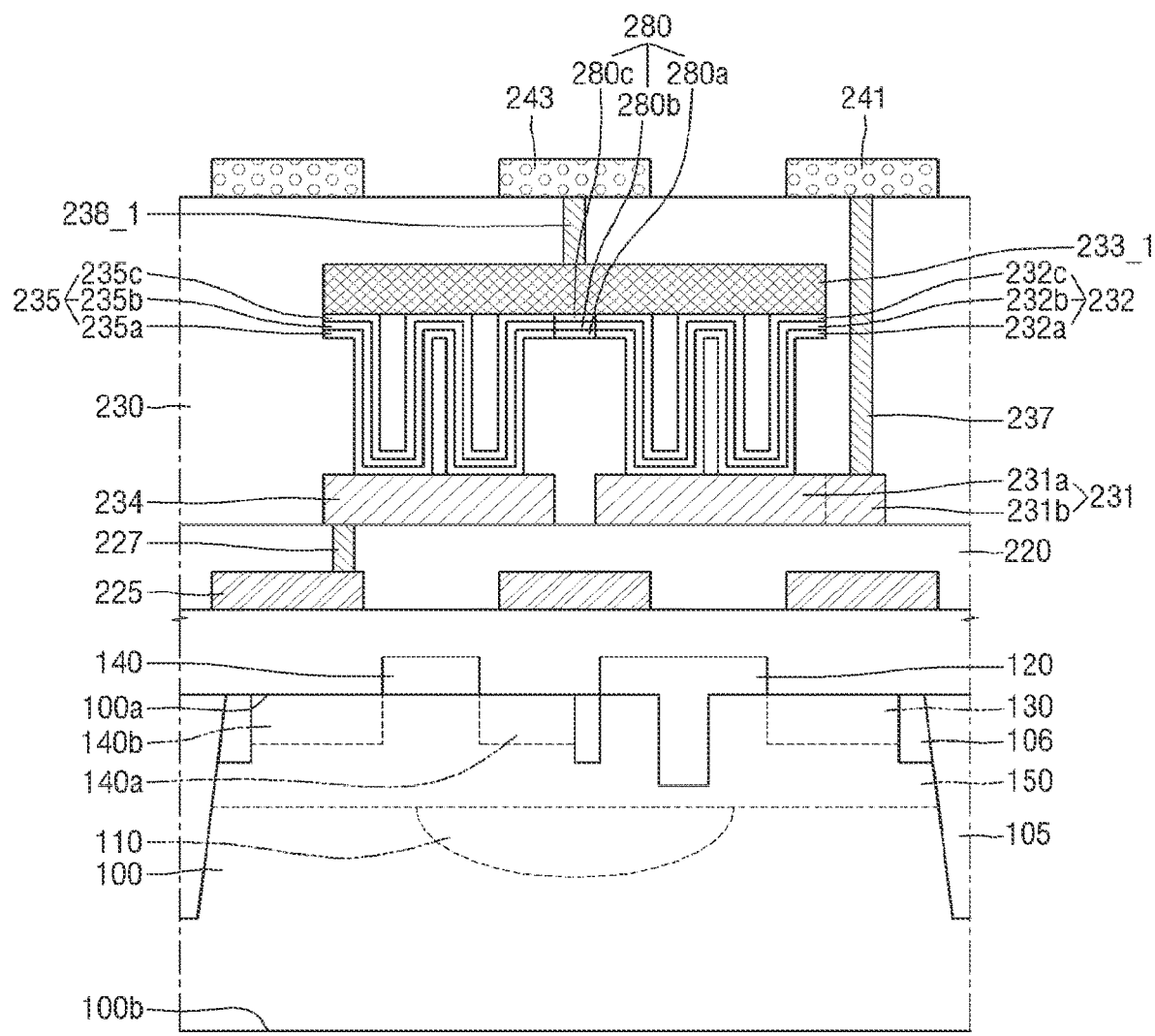

FIGS. 20 to 22 are cross-sectional views of intermediate steps illustrating a method for fabricating an image sensor according to some embodiments of the present invention. For simplicity of explanation, repeated parts of contents described with reference to FIGS. 1 to 19 will be briefly explained or omitted.

Hereinafter, an image sensor including two capacitors that share the upper capacitor connection pattern will be described, and the above-described fabricating processes illustrated in FIGS. 7 to 13 may be similarly applied. That is, the steps will be described after the processes in which the first wiring layer 220 is formed on the first surface 100a of the substrate 100, the pattern 400 is etched to pattern the first lower capacitor and the second lower capacitor, the conductive film 263a, the dielectric film 263b and the conductive film 263c are deposited to form a capacitor structure 263, and the pattern 270 is deposited on the capacitor structure 263.

Referring to FIG. 20, the upper capacitor connection pattern 233_1 may be patterned through the etching process of the pattern 270. Further, the first capacitor structure 232 and the second capacitor structure 235 may be patterned through the etching process of the capacitor structure 263. At this time, the first capacitor structure 232 and the second capacitor structure 235 may be connected to each other. As illustrated in FIG. 20, a capacitor structure 280 including a conductive film 280a, a dielectric film 280b and a conductive film 280c may be formed in a region in which the first capacitor structure 232 and the second capacitor structure 235 are connected to each other. The capacitor structure 280 may be between the first capacitor structure 232 and the second capacitor structure 235 and may be connected to both the first capacitor structure 232 and the second capacitor structure 235.

Referring to FIG. 21, a second contact 237 connected to the landing region 231b, and a contact 238_1 connected to the upper capacitor connection pattern 233_1 may be formed.

The interlayer insulating film 230 may be formed by stacking the dielectric film 230_1 exposed by etching of the dielectric film 260, and the dielectric film 230_2 covering the upper capacitor connection pattern 233_1.

Subsequently, trenches (not illustrated) may be formed by patterning the interlayer insulating film 230, and a second contact 237 and a contact 238_1 may be formed by stacking a metal material on the formed trenches. The metal material for forming the second contact 237 and the contact 238_1 may be, for example, tungsten (W), but the present invention is not limited thereto.

Referring to FIG. 22, the second wirings 241 and 243 may be formed on the interlayer insulating film 230.

The second wirings 241 and 243 may be patterned by laminating (e.g., depositing) a metal pattern on the interlayer insulating film 230 and etching the metal pattern. As illustrated in FIG. 22, the second wiring 241 may be connected to the landing region 231b of the first lower capacitor connection pattern 231 through the second contact 237.

Further, the second wiring 243 may be connected to the upper capacitor connection pattern 233_1 through the contact 238_1.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. An image sensor comprising:
a substrate including a first surface and a second surface that is opposite the first surface, the second surface of the substrate being configured to receive incident light;
an insulating layer which is above the substrate and includes a third surface and a fourth surface that is opposite the third surface;
a first structure which is formed at the third surface and includes a first lower capacitor connection pattern and a first capacitor structure, the first lower capacitor connection pattern including a capacitor connection region and a landing region protruding from the capacitor connection region and being a conductive layer;
a second structure which is spaced apart from the first structure in a first direction and includes a second lower capacitor connection pattern and a second capacitor structure, a surface of the second lower capacitor connection pattern facing the substrate and a surface of the first lower capacitor connection pattern facing the substrate being coplanar, and a surface of the second capacitor structure facing the substrate and a surface of the first capacitor structure facing the substrate being coplanar;
a first wire on the fourth surface and connected to the landing region;
a second wire that is on the fourth surface and the second structure and is connected to the first capacitor structure and the second capacitor structure; and
a lens above the second surface of the substrate,
wherein the first lower capacitor connection pattern is between the substrate and the first capacitor structure,
the first capacitor structure directly contacts the capacitor connection region of the first lower capacitor connection pattern and includes a first conductive pattern, a dielectric pattern, and a second conductive pattern sequentially stacked on the capacitor connection region, and
the landing region of the first lower capacitor connection pattern protrudes beyond a side surface of the first conductive pattern of the first capacitor structure in the first direction.

2. The image sensor of claim 1, further comprising:
a third wire that is between the first surface of the substrate and the second structure and is connected to the second lower capacitor connection pattern.

3. The image sensor of claim 2, further comprising:
a first contact which connects the landing region and the first wire; and
a second contact which connects the second lower capacitor connection pattern and the third wire.

4. The image sensor of claim 1, wherein a surface of the landing region facing the substrate and a surface of the capacitor connection region facing the substrate are coplanar.

5. The image sensor of claim 1, further comprising:
a first upper capacitor connection pattern above the first capacitor structure; and
a second upper capacitor connection pattern above the second capacitor structure,
wherein the second wire, the first upper capacitor connection pattern, and the second upper capacitor connection pattern are connected.

6. The image sensor of claim 5, wherein the first upper capacitor connection pattern and the second upper capacitor connection pattern are a first portion and a second portion of a common upper capacitor connection pattern, respectively, and
wherein a surface of the first upper capacitor connection pattern facing the substrate and a surface of the second upper capacitor connection pattern facing the substrate are coplanar.

7. The image sensor of claim 6, further comprising:
a first contact which connects the landing region and the first wire; and
a third contact which connects the first upper capacitor connection pattern, the second upper capacitor connection pattern, and the second wire.

8. The image sensor of claim 1, wherein the first lower capacitor connection pattern and the second lower capacitor connection pattern include tungsten (W), and
wherein the first conductive pattern, the dielectric pattern, and the second conductive pattern include titanium nitride (TiN), zirconium oxide (ZrO), and/or aluminum oxide (AlO).

9. The image sensor of claim 1, further comprising an insulating film between the first lower capacitor connection pattern and the first wire,
wherein the insulating film directly contacts the side surface of the first conductive pattern of the first capacitor structure.

10. The image sensor of claim 1, further comprising a first contact connecting the landing region of the first lower capacitor connection pattern and the first wire,
wherein the first lower capacitor connection pattern is between the substrate and the first contact,
each of the capacitor connection region and the landing region comprises a fifth surface facing the substrate and a sixth surface opposite the fifth surface, and the sixth surface of the capacitor connection region is coplanar with the sixth surface of the landing region, and
the sixth surface of the capacitor connection region directly contacts the first capacitor structure, and the sixth surface of the landing region directly contacts the first contact.

11. An image sensor comprising:
a substrate including a first surface and a second surface opposite the first surface;
an insulating layer which is above the substrate and includes a third surface and a fourth surface that is opposite the third surface;
a first capacitor connection pattern which is formed at the third surface, the first capacitor connection pattern including a capacitor connection region and a landing region and being a conductive layer;
a first capacitor structure above the capacitor connection region;
a first wire on the fourth surface and connected to the landing region;
a first contact connecting the landing region and the first wire; and
a lens above the second surface of the substrate, wherein each of the capacitor connection region and the landing region comprises a fifth surface facing the substrate and a sixth surface opposite the fifth surface, and the sixth surface of the capacitor connection region directly contacts the first capacitor structure, and the sixth surface of the landing region directly contacts the first contact.

12. The image sensor of claim 11, further comprising:
a first upper capacitor connection pattern above the first capacitor structure; and
a second wire connected to the first upper capacitor connection pattern.

13. The image sensor of claim 12, further comprising:
a second capacitor connection pattern spaced apart from the first capacitor connection pattern, a surface of the first capacitor connection pattern facing the substrate and a surface of the second capacitor connection pattern facing the substrate being coplanar;
a second capacitor structure above the second capacitor connection pattern; and
a second upper capacitor connection pattern above the second capacitor structure and connected to the second wire.

14. The image sensor of claim 13, further comprising a third wire that is between the first surface of the substrate and the second capacitor connection pattern and is connected to the second capacitor connection pattern.

15. The image sensor of claim 12, further comprising:
a second capacitor connection pattern spaced apart from the first capacitor connection pattern, a surface of the first capacitor connection pattern facing the substrate and a surface of the second capacitor connection pattern facing the substrate being coplanar;
a second capacitor structure above the second capacitor connection pattern; and
a third wire that is between the first surface of the substrate and the second capacitor connection pattern and is connected to the second capacitor connection pattern,
wherein the first upper capacitor connection pattern is connected to a top of the first capacitor structure and a top of the second capacitor structure.

16. The image sensor of claim 11, wherein the first capacitor connection pattern includes tungsten (W), and
wherein the first capacitor structure includes titanium nitride (TiN), zirconium oxide (ZrO), and/or aluminum oxide (AlO).

17. The image sensor of claim 12, wherein each of the first wire and the second wire are formed on the fourth surface.

18. The image sensor of claim 11, wherein the substrate and the first capacitor connection pattern are spaced apart from each other in a vertical direction,
the first capacitor structure comprises a first conductive pattern, a dielectric pattern, and a second conductive pattern sequentially stacked on the capacitor connection region, and
the landing region protrudes beyond a side surface of the first conductive pattern of the first capacitor structure in a horizontal direction.

19. The image sensor of claim 11, further comprising an insulating film between the first capacitor connection pattern and the first wire,
wherein the first capacitor structure comprises a first conductive pattern, a dielectric pattern, and a second conductive pattern sequentially stacked on the capacitor connection region, and each of the first conductive pattern, the dielectric pattern, and the second conductive pattern comprises a side surface facing the first contact, and
wherein the insulating film directly contacts the side surfaces of the first conductive pattern, the dielectric pattern, and the second conductive pattern.

20. The image sensor of claim 11, wherein the substrate and the first capacitor connection pattern are spaced apart from each other in a vertical direction,
the landing region protrudes from the capacitor connection region in a first horizontal direction, and
the capacitor connection region has a first length in a second horizontal direction that is perpendicular to the first horizontal direction, the landing region has a second length in the second horizontal direction, and the first length is longer than the second length.

* * * * *